(12) United States Patent
Hezar et al.

(10) Patent No.: US 8,483,856 B2
(45) Date of Patent: Jul. 9, 2013

(54) SYSTEM AND METHOD FOR CORRECTING PHASE NOISE IN DIGITAL-TO-ANALOG CONVERTER OR ANALOG-TO-DIGITAL CONVERTER

(75) Inventors: Rahmi Hezar, Plano, TX (US); Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 531 days.

(21) Appl. No.: 12/783,290

(22) Filed: May 19, 2010

(65) Prior Publication Data

US 2011/0285433 A1    Nov. 24, 2011

(51) Int. Cl.
*G06F 17/00* (2006.01)

(52) U.S. Cl.
USPC .............................. 700/94; 341/126; 341/144

(58) Field of Classification Search
USPC .................... 381/97–98, 3; 700/94; 341/144, 341/126
See application file for complete search history.

(56) References Cited

U.S. PATENT DOCUMENTS 7,587,131 B1 * 9/2009 Melanson et al. ............ 386/204
2008/0165862 A1 * 7/2008 Takahashi ................ 375/240.28

* cited by examiner

*Primary Examiner* — Disler Paul
(74) *Attorney, Agent, or Firm* — Wade J. Brady, III; Frederick J. Telecky, Jr.

(57) ABSTRACT

A circuit includes a digital oscillator, a phase lock loop (PLL), a digital signal generator, a correction circuit and a digital-to-analog converter DAC (DAC). The digital oscillator can output a reference clock signal. The PLL can output a system clock signal based on the reference clock signal. The digital signal generator can output a digital signal based on the system clock signal. The correction circuit can output a pre-distorted signal based on the reference clock signal, the system clock signal and the digital signal. The DAC can output an analog signal based on the pre-distorted signal and the system clock signal.

18 Claims, 10 Drawing Sheets

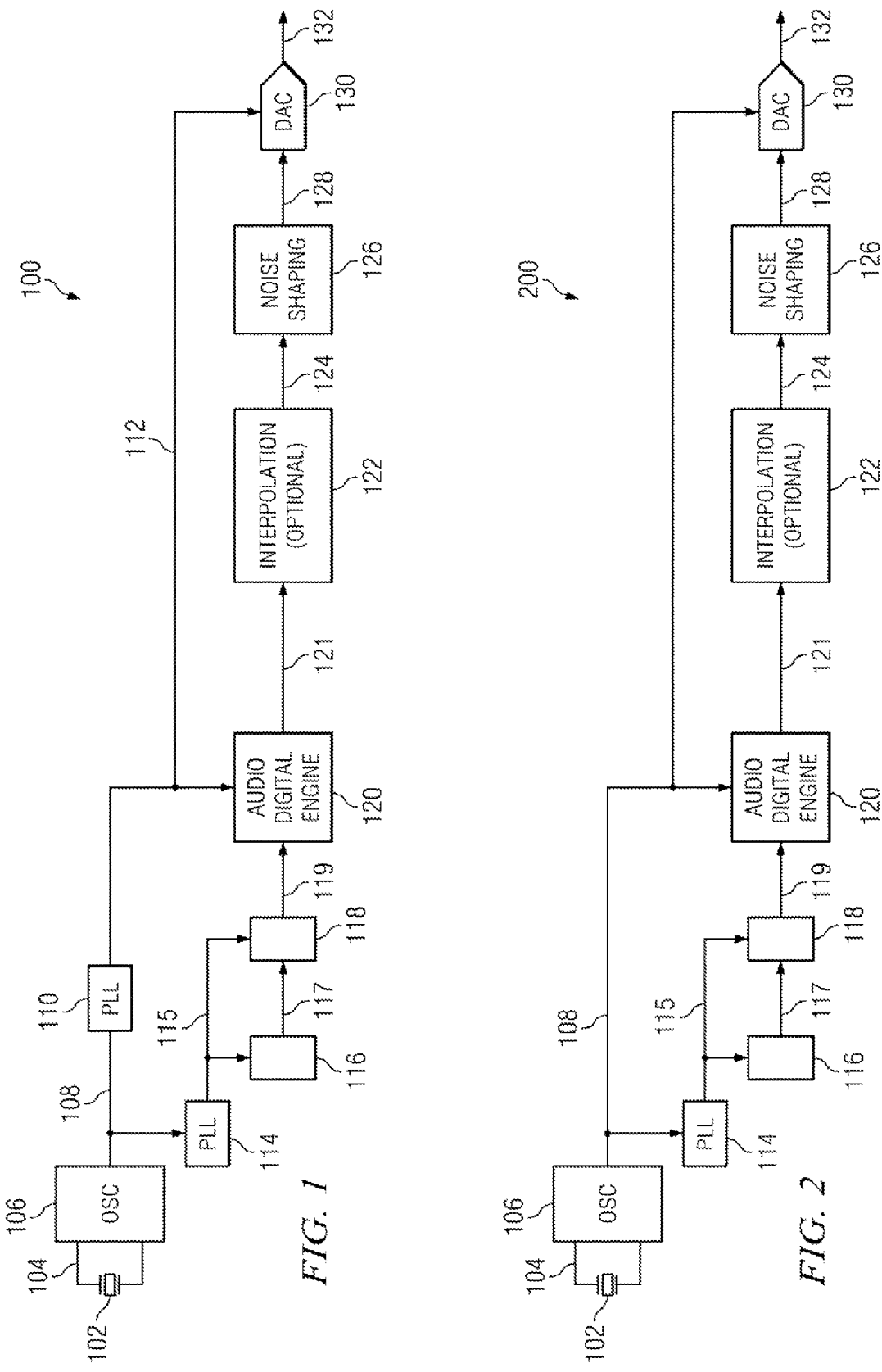

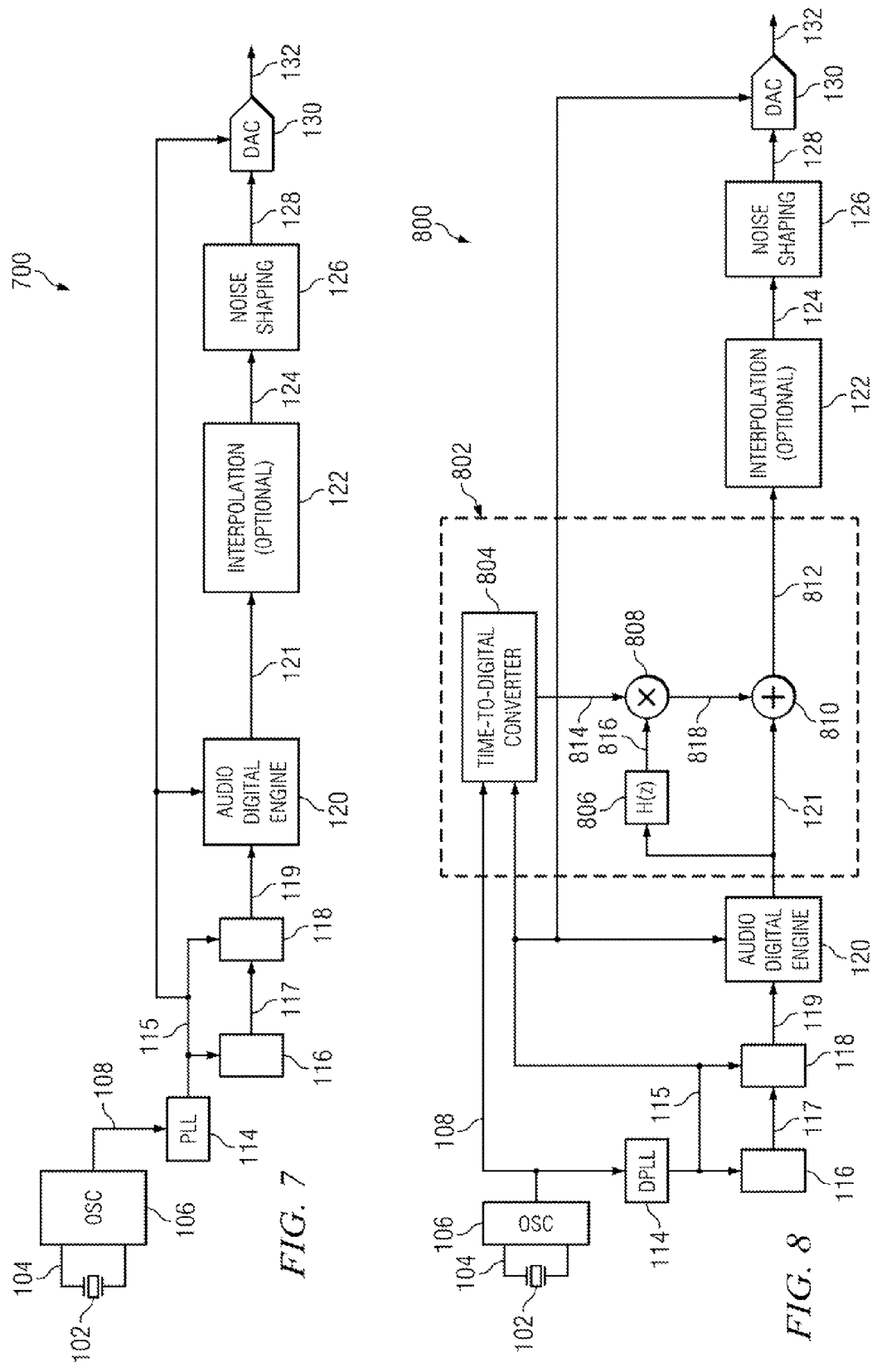

SYSTEM AND METHOD FOR CORRECTING PHASE NOISE IN DIGITAL-TO-ANALOG CONVERTER OR ANALOG-TO-DIGITAL CONVERTER

BACKGROUND

Generation or conversion of analog audio from a source of digital audio by conventional methods typically involves a choice between higher fidelity (with increased cost and increased power consumption) or lower cost and lower power consumption (with lower fidelity).

Higher fidelity audio can be achieved in converting digital audio to analog by including a higher performance Phase Locked Loop (PLL) for driving or clocking sensitive audio processing electronic circuitry. A higher performance PLL provides a clocking signal with a reduced amount of clock signal jitter compared to a low performance PLL. However, the reduced clock signal jitter provided by the higher performance PLL comes at the expense of increased cost and increased power consumption. The increased cost and power consumption associated with a higher performance PLL are a result of a need for an increased amount of semiconductor circuitry and "real estate." Furthermore, increased power consumption negatively impacts the amount of time a battery can supply electrical power to an electronic device containing a higher performance PLL. In contrast, cost and power consumption can be decreased by using a lower performance PLL. However, the lower cost and lower power consumption results in producing audio with lower fidelity.

PLLs are versatile electronic components that can be configured to generate a wide array of clock signals for driving electronic circuitry. A PLL may function to convert an input clock signal with a corresponding frequency into a clock signal having an altogether different corresponding frequency. A PLL may be adept at creating a clock signal with a precise frequency, however, the clock signal created by the PLL may also exhibit jitter. Jitter is the deviation in some aspect (i.e. phase, amplitude, or width) of the pulses in a digital signal. The jitter exhibited by PLLs is inherent to the design of PLLs and can be reduced, but at the expense of increased circuitry, power consumption and complexity.

Digital audio equipment is generally configured to convert digital or discrete audio information to an analog signal for transmission to and reception by a human ear.

In general, the process for converting the digital audio information into an analog signal includes the use of a Digital-to-Analog Converter (DAC). A DAC typically operates to convert a digital signal into a proportional amount of electrical voltage or current as represented by the digital signal. Quantization error or noise is inherent in DACs and is a result of the finite resolution provided by DACs. The accuracy of the conversion of digital information to analog by a DAC is further impacted by clock signal jitter resident in the signal used to clock or drive the DAC. A low amount of clock signal jitter corresponds to increased accuracy and an increased signal-to-noise ratio in converting the digital audio information to its analog representation. Conversely, a higher amount of clock signal jitter corresponds to lower accuracy and a lower signal-to-noise ratio in converting the digital audio information to its analog representation.

FIGS. 1-7 will now be presented in order to further illustrate issues related to converting digital audio to its analog representation.

FIG. 1 illustrates a conventional circuit for converting digital audio information to its analog representation.

A circuit 100 includes a crystal 102, a digital oscillator 106, an audio PLL 110, a system PLL 114, a compressed digital audio source 116, a digital audio decompression portion 118, an audio signal generator portion 120, an interpolator 122, a noise shaping portion 126 and a DAC 130. In this illustration, each of digital oscillator 106, audio PLL 110, system PLL 114, compressed digital audio source 116, digital audio decompression portion 118, audio signal generator portion 120, interpolator 122, noise shaping portion 126 and DAC 130 are illustrated as distinct devices. However, at least one of digital oscillator 106, audio PLL 110, system PLL 114, compressed digital audio source 116, digital audio decompression portion 118, audio signal generator portion 120, interpolator 122, noise shaping portion 126 and DAC 130 may be combined as a unitary device.

Crystal 102 is operable to generate an electrical signal 104. Digital oscillator 106 is arranged to output a reference clock signal 108 based on electrical signal 104. In this example, digital oscillator 106 is arranged to receive electrical signal 104 directly from crystal 102. Alternatively, intermediate circuitry may be included to modify electrical signal 104 prior to digital oscillator 106. Non-limiting examples of intermediate circuitry include matching networks, amplifiers, filters, resistors, etc.

Audio PLL 110 is arranged to output an audio clock signal 112 based on reference clock signal 108. In this example, audio PLL 110 is arranged to receive reference clock signal 108 directly from digital oscillator 106. Alternatively, intermediate circuitry may be included to modify reference clock signal 108 prior to audio PLL 110.

System PLL 114 is arranged to output a system clock signal 115 based on reference clock signal 108. In this example, system PLL 114 is arranged to receive reference clock signal 108 directly from digital oscillator 106. Alternatively, intermediate circuitry may be included to modify reference clock signal 108 prior to system PLL 114.

Compressed digital audio source 116 is arranged to output a compressed digital audio signal 117 based on system clock signal 115. In this example, compressed digital audio source 116 is arranged to receive system clock signal 115 directly from system PLL 114. Alternatively, intermediate circuitry may be included to modify system clock signal 115 prior to compressed digital audio source 116.

Digital audio decompression portion 118 is arranged to output a decompressed digital audio signal 119 based on system clock signal 115 and compressed digital audio signal 117. In this example, digital audio decompression portion 118 is arranged to receive system clock signal 115 directly from system PLL 114 and to receive compressed digital audio signal 117 directly from compressed digital audio source 116. Alternatively, intermediate circuitry may be included to modify at least one of system clock signal 115 and compressed digital audio signal 117 prior to digital audio decompression portion 118.

Audio signal generator portion 120 is arranged to output a digital audio signal 121 based on audio clock signal 112 and decompressed digital audio signal 119. In this example, audio signal generator portion 120 is arranged to receive audio clock signal 112 directly from audio PLL 110 and to receive decompressed digital audio signal 119 directly from digital audio decompression portion 118. Alternatively, intermediate circuitry may be included to modify at least one of audio clock signal 112 and decompressed digital audio signal 119 prior to audio signal generator portion 120.

Interpolator 122 is arranged to output an interpolated signal 124 based on digital audio signal 121. In this example, interpolator 122 is arranged to receive digital audio signal 121 directly from audio signal generator portion 120. Alternatively, intermediate circuitry may be included to modify digital audio signal 121 prior to interpolator 122.

Noise shaping portion 126 is arranged to output a shaped signal 128 based interpolated signal 124. In this example, noise shaping portion 126 is arranged to receive interpolated signal 124 directly from interpolator 122. Alternatively, intermediate circuitry may be included to modify interpolated signal 124 prior to noise shaping portion 126.

DAC 130 is arranged to output an analog signal 132 based on audio clock signal 112 and shaped signal 128. In this example, DAC 130 is arranged to receive audio clock signal 112 directly from audio PLL 110 and to receive shaped signal 128 directly from noise shaping portion 126. Alternatively, intermediate circuitry may be included to modify at least one of audio clock signal 112 and shaped signal 128 prior to DAC 130.

Crystal 102 generates electrical signal 104 so as to have a very precise frequency. However, the frequency of electrical signal 104 is typically limited as a result of the capacitance and inductance of semiconductor packaging devices. A too high frequency for electrical signal 104 may be distorted by the capacitance and inductance of a semiconductor package. Accordingly, the frequency of electrical signal 104 is typically of a lower frequency and stepped up internally within a semiconductor device using a PLL, as the capacitance and inductance resident within a semiconductor device is typically much less than the capacitance and inductance of a semiconductor package. The lower capacitance and inductance resident within a semiconductor device, as compared to the semiconductor packaging, allows for generating very high clock signal frequencies internal to a semiconductor device using a PLL. However, the high frequency clock signal comes at the expense of increased clock signal jitter.

In this case, digital oscillator 106 acts as a frequency converter and generates reference clock signal 108 in a manner appropriate for reception by other associated electronic components.

Audio PLL 110 converts reference clock signal 108 into audio clock signal 112 having a different frequency from reference clock signal 108. Typically, audio PLL 110 is programmable, such that the frequency of audio clock signal 112 may be changed as desired. Furthermore, the frequency of audio clock signal 112 is typically a higher frequency than the frequency of reference clock signal 108.

System PLL 114 converts reference clock signal 108 into system clock signal 115 having a different frequency from reference clock signal 108. Typically, system PLL 114 is programmable, such that the frequency of system clock signal 115 may be changed as desired. Furthermore, the frequency of system clock signal 115 is typically a higher frequency than the frequency of reference clock signal 108.

Compressed digital audio source 116 is a source of compressed digital audio data, (e.g., music). Non-limiting examples sources of digital audio include random access memory (RAM), read-only memory (ROM), compact disk (CD), digital video disk (DVD) and hard disk. Digital audio is typically compressed in order to reduce the amount of storage space required for storage and to reduce the amount of bandwidth required for transmitting and receiving the digital audio.

Digital audio decompression portion 118 converts compressed digital audio to uncompressed digital audio. Non-limiting examples of compressed digital audio formats include MP3, AAC and AC3. Decompression of digital audio requires a significant amount of computational processing. This increased computational processing may require system clock signal 115 to operate at a significantly higher frequency than the frequency at which the digital audio is sampled. Typically, digital audio decompression portion 118 may not operate at the reduced clock frequency of audio clock signal 112, as it would not provide digital audio decompression portion 118 enough computational processing power for decompressing a source of compressed audio.

Audio signal generator portion 120 processes a decompressed audio signal such that it can be processed by circuitry operating at a reduced clock frequency to support further processing of a digital audio signal. Audio signal generator portion 120 outputs the digital audio data as digital audio signal 121 in synchronization with audio clock signal 112, as will be discussed in more detail below.

The digital audio information to be supplied by circuit 100 may need to have a higher frequency than the frequency of digital audio signal 121. Interpolator 122 creates digital audio information, which is an estimate based on digital audio signal 121. For example, audio data within digital audio signal 121 might have been sampled at a frequency of 8 KHz, whereas the audio data to be supplied by circuit 100 might be required to have a sampling frequency of 16 KHz. Interpolator 122 may function to insert estimated audio data between the actual sampled audio data within digital audio signal 121 to generate interpolated signal 124.

Noise shaping portion 126 removes high frequency portions of interpolated signal 124 to reduce distortion within interpolated signal 124 to generate shaped signal 128.

DAC 130 converts shaped signal 128, which is a digital signal, to analog signal 132, to be output by circuit 100.

Typically, when generating higher fidelity audio, audio PLL 110 is configured as a higher performance PLL, which produces audio clock signal 112 with a lowered amount of clock signal jitter. The lower amount of clock signal jitter provided by audio PLL 110 is realized through increased electronic circuitry, which results in increased costs and increased power consumption. In contrast to audio PLL 110, system PLL 114 is a lower quality PLL with an increased amount of clock signal jitter. However, since digital audio decompression portion 118 is less sensitive to clock signal jitter, the lower quality system PLL 114 is sufficiently capable of driving digital audio decompression portion 118. Furthermore, since system PLL 114 is a lower performance PLL, its cost and power consumption is relatively lower than the cost and power consumption of the higher performance audio PLL 110.

Another conventional method for increasing the fidelity when converting a digital audio signal to an analog audio signal involves driving or clocking, sensitive audio circuitry directly from a digital oscillator. The digital oscillator provides a clock signal with a lower amount of clock signal jitter, cost and power dissipation as compared to a PLL, but at the expense of a lower clock signal frequency than provided by a PLL.

FIG. 2 illustrates a circuit 200, a conventional circuit for converting digital audio information to analog similar to FIG. 1 except with a PLL component removed and the clock signal for the audio processing portion of the circuit driven by a digital oscillator instead of by a PLL.

As illustrated in FIG. 2, audio PLL 110 which was included in FIG. 1 is not included in FIG. 2. As shown in FIG. 2, reference clock signal 108 is directly provided to audio signal generator portion 120 and DAC 130.

The clock signal frequency of audio clock signal 112 as supplied by audio PLL 110 in FIG. 1 is higher than the clock signal frequency of reference clock signal 108 supplied by digital oscillator 106 in FIG. 2. As will be demonstrated in further discussion, the lower clock signal frequency of reference clock signal 108 supplied by digital oscillator 106 to audio signal generator portion 120 and DAC 130 in FIG. 2 results in an increased amount of noise over the amount of noise as produced by the circuit in FIG. 1. The increased amount of noise produced in FIG. 2 decreases the signal-to-noise ratio and fidelity of the output analog signal as compared to that of FIG. 1.

A discussion associated with an ideal versus an actual audio signal will now be presented with respect to FIG. 3 for further comparing and contrasting the conventional circuits of FIG. 1 and FIG. 2.

FIG. 3 illustrates waveforms associated with circuit 100 of FIG. 1 and circuit 200 of FIG. 2.

FIG. 3 includes a waveform 300, a waveform 302 and a waveform 304. Waveform 300 represents an example ideal output signal for analog signal 132 from DAC 130. Waveform 302 represents an example actual output signal for analog signal 132 from DAC 130. Waveform 304 represents an example error waveform, the difference between waveform 300 and waveform 302.

An x-axis 306, which is shared by each of waveform 300, waveform 302 and waveform 304, represents units of time. A y-axis 307 represents voltage.

Waveform 300 starts at time $t_0$ and includes a pulse 308, a pulse 310 and a pulse 312. Pulse 308 is positive in voltage and has a rising edge 314 at time $t_2$ and a falling edge 316 at time $t_3$. Pulse 310 is positive in voltage and has a rising edge 318 at time $t_5$ and a falling edge 320 at time $t_7$. Pulse 312 is positive in voltage and has a rising edge 322 at time $t_{10}$ and a falling edge 324 at time $t_{12}$.

Waveform 302 starts at time $t_0$ and includes a pulse 326, a pulse 328 and a pulse 330. Pulse 326 is positive in voltage and has a rising edge 332 at time $t_1$ and a falling edge 334 at time $t_4$. Pulse 328 is positive in voltage and has a rising edge 336 at time $t_6$ and a falling edge 338 at time $t_8$. Pulse 330 is positive in voltage and has a rising edge 340 at time $t_9$ and a falling edge 342 at time $t_{11}$.

Waveform 304 starts at time $t_0$ and includes a pulse 344, a pulse 346, a pulse 348, a pulse 350, a pulse 352 and a pulse 354. Pulse 344 is positive in voltage and has a rising edge 356 at time $t_1$ and a falling edge 358 at time $t_2$. Pulse 346 is positive in voltage and has a rising edge 360 at time $t_3$ and a falling edge 362 at time $t_4$. Pulse 348 is negative in voltage and has a falling edge 364 at time $t_5$ and a rising edge 366 at time $t_6$. Pulse 350 is positive in voltage and has a rising edge 368 at time $t_7$ and a falling edge 370 at time $t_8$. Pulse 352 is positive in voltage and has a rising edge 372 at time $t_9$ and a falling edge 374 at time $t_{10}$. Pulse 354 is negative in voltage and has a falling edge 376 at time $t_{11}$ and a rising edge 378 at time $t_{12}$.

Waveform 304 is the difference between waveform 300 and waveform 302 and represents the error between an ideal example output signal for analog signal 132 from DAC 130 and an actual example output signal for analog signal 132 from DAC 130. In this example, a positive pulse voltage in waveform 304 indicates that the ideal output signal for analog signal 132 from DAC 130 is a binary LOW whereas the actual example output signal for analog signal 132 from DAC 1.30 is a binary HIGH. Similarly, in this example, a negative pulse voltage in waveform 304 indicates that the ideal output signal for analog signal 132 from DAC 130 is a binary HIGH whereas the actual example output signal for analog signal 132 from DAC 130 is a binary LOW.

Between time $t_0$ and time $t_1$, the ideal DAC output as illustrated in waveform 300 is a binary LOW and the actual DAC output as illustrated in waveform 302 is also a binary LOW. Therefore, the difference between waveform 300 and waveform 302 during the time period between time $t_0$ and time $t_1$ results in a binary LOW in waveform 304. Between time $t_1$ and time $t_2$, the ideal DAC output as illustrated in waveform 300 is a binary LOW, whereas the actual DAC output as illustrated in waveform 302 is a binary HIGH. This discrepancy may take place for any number of reasons, which is not the focus of this discussion. For purposes of this discussion, presume that a discrepancy exists nonetheless. Here, the difference between waveform 300 and waveform 302 during the time period between time $t_1$ and time $t_2$ results in pulse 344, which is positive in voltage to indicate a positive difference. Between time $t_2$ and time $t_3$, the ideal DAC output as illustrated in waveform 300 is a binary HIGH and the actual DAC output as illustrated in waveform 302 is also a binary HIGH. Therefore, the difference between waveform 300 and waveform 302 during the time period between time $t_2$ and time $t_3$ results in a binary LOW in waveform 304.

To simplify the discussion, the above analysis of waveform 300, waveform 302 and waveform 304 for the time periods at or around pulse 344 may be used to analyze time periods at or around pulses 346, 350 and 352.

Between time $t_4$ and time $t_5$, the ideal DAC output as illustrated in waveform 300 is a binary LOW and the actual DAC output as illustrated in waveform 302 is also a binary LOW. Therefore, the difference between waveform 300 and waveform 302 during the time period between time $t_4$ and time $t_5$ results in a binary LOW in waveform 304. Between time $t_5$ and time $t_6$, the ideal DAC output as illustrated in waveform 300 is a binary HIGH, whereas the actual DAC output as illustrated in waveform 302 is a binary LOW. This discrepancy may take place for any number of reasons, which is not the focus of this discussion. For purposes of this discussion, presume that a discrepancy exists nonetheless. Here, the difference between waveform 300 and waveform 302 during the time period between time $t_5$ and time $t_6$ results in pulse 348, which is negative in voltage to indicate a negative difference. Between time $t_6$ and time $t_7$, the ideal DAC output as illustrated in waveform 300 is a binary HIGH and the actual DAC output as illustrated in waveform 302 is also a binary HIGH. Therefore, the difference between waveform 300 and waveform 302 during the time period between time $t_2$ and time $t_3$ results in a binary LOW in waveform 304.

To simplify the discussion, the above analysis of waveform 300, waveform 302 and waveform 304 for the time periods at or around pulse 348 may be used to analyze time periods at or around pulse 354.

Waveform 300 represents the desired signal output of analog signal 132, ie., a perfect rendition of the audio signal. However, due to clock signal jitter and other effects, the actual output of analog signal is waveform 302. If the reproduction of the audio signal were performed perfectly, waveform 300 and waveform 302 would be identical and thus waveform 304 would appear as a binary LOW line. However, in practicality, the error in the actual signal may be measured as pulses 344, 346, 348, 350, 352 and 354.

A further discussion associated with an ideal versus an actual audio signal will now be presented in FIG. 4 for further comparing and contrasting the conventional circuits of FIG. 1 and FIG. 2 and the conventional waveforms of FIG. 3.

FIG. 4A illustrates a conventional frequency spectrum graph as generated by the conventional circuits of FIG. 1 and FIG. 2 and waveform 300 of FIG. 3.

FIG. 4A illustrates an ideal DAC frequency spectrum 402 of a signal x(n) where x represents a digital audio signal amplitude sampled at a discrete time period n. For example, x(n) may be represented as x(0), x(1), x(2) . . . .

FIG. 4A has a y-axis 410 with dimensions of magnitude and units of volts squared and an x-axis 412 with dimensions of frequency and units of Hertz. The frequency range for x-axis 412 includes frequencies from 0 Hz increasing up to the frequency used to sample the audio divided by 2 which is denoted as a divided sample frequency 414.

An output signal spectrum 416 is located at a signal frequency 418 of x-axis 412. A cycle-to-cycle noise frequency spectrum 422 initiates at a cutoff frequency 420 located on x-axis 412 and increases monotonically until it terminates at divided sample frequency 414 on x-axis 412. Cycle-to-cycle noise is the average difference in length of any two adjacent cycles.

FIG. 4B illustrates a conventional frequency spectrum graph as generated by the conventional circuits of FIG. 1 and FIG. 2 and waveform 302 of FIG. 3.

FIG. 4B illustrates a jitter error frequency spectrum 404 of a signal x(n)−x(n−1), where x(n) represents a digital audiosignal amplitude and x(n−1) represents the audio signal x delayed by one sample. FIG. 4B demonstrates the negative results of experiencing jitter in converting a digital audio signal to an analog signal.

FIG. 4B has a y-axis 424 with dimensions of magnitude and units of volts squared and an x-axis 426 with dimension of frequency and units of Hertz. The frequency range for x-axis 426 includes frequencies from 0 Hertz increasing up to the frequency used to sample the audio divided by 2 which is denoted as a divided sample frequency 428.

An output signal spectrum 430 is located at a signal frequency 432 of x-axis 426. A jitter noise frequency spectrum 436 initiates at a cutoff frequency 434 located on x-axis 426 and increases in a monotonic fashion until it terminates at divided sample frequency 428 on x-axis 426.

As illustrated in FIG. 4A-B, clock signal jitter induced into a digital audio circuit increases the relative magnitude of jitter noise frequency spectrum 436 as compared to output signal spectrum 430, both shown in FIG. 4B, and is significantly larger than the relative magnitude of cycle-to-cycle noise frequency spectrum 422 as compared to output signal spectrum 416 shown in FIG. 4A. As a result of induced clock signal jitter, the signal-to-noise ratio as demonstrated in FIG. 4B is significantly less than the signal-to-noise ratio as shown in FIG. 4A. The audio as depicted by FIG. 4B has less quality and fidelity due to increased clock signal jitter than the audio as illustrated in FIG. 4A. The more clock signal jitter induced, the more the audio of FIG. 4B is degraded when compared to the audio of FIG. 4A. Similarly, the more waveform 302 and waveform 300 of FIG. 3 are different as indicated by waveform 304 of FIG. 3, the more clock signal jitter is induced, resulting in increased degradation of the resulting analog audio signal. For example, the larger the clock signal error or clock difference between waveform 300 and waveform 302 of FIG. 3, the lower the signal-to-noise ratio of FIG. 4B which corresponds to a lower fidelity digital audio to analog conversion.

FIG. 4C illustrates a clock error frequency spectrum as generated by the conventional circuits of FIG. 1 and FIG. 2 and waveform 302 of FIG. 3.

FIG. 4C illustrates a clock signal error frequency spectrum 406. Clock signal error frequency spectrum 406 may be represented as the frequency spectrum of the clock signal jitter, $\Delta t$, divided by the period of the clock signal, $T_{clk}$. FIG. 4C demonstrates the frequency spectrum of error in a clock signal.

FIG. 4C has a y-axis 438 with dimensions of magnitude and units of volts squared and an x-axis 440 with dimensions of frequency and units of Hertz. The frequency range for x-axis 440 includes frequencies from 0 Hertz increasing up to the frequency used to sample the audio divided by 2 which is denoted as a divided sample frequency 442.

Long term, or accumulated, jitter is the change in a clock signal's output from the ideal position, measured over several consecutive cycles. A long term jitter noise frequency spectrum 444 is located in the range from 0 Hertz up to a cutoff frequency 446. Long term jitter noise frequency spectrum 444 has a maximum magnitude at a maximum 448. A cycle-to-cycle noise frequency spectrum 450 extends from cutoff frequency 446 on x-axis 440 up to divided sample frequency 442 on x-axis 440. Cycle-to-cycle noise frequency spectrum 450 decreases monotonically from cutoff frequency 446 on x-axis 440 up to a cutoff frequency 452 on x-axis 440. The magnitude of cycle-to-cycle noise frequency spectrum 450 is flat from cutoff frequency 452 on x-axis 440 up to divided sample frequency 442 on x-axis.

FIG. 4C illustrates how the frequency spectrum of long term jitter noise as denoted by long term jitter noise frequency spectrum 444 has a predominate impact on audio quality as compared to the frequency spectrum of cycle-to-cycle noise as depicted by cycle-to-cycle noise frequency spectrum 450. The frequency spectrum of long term jitter noise is located in the audio frequency spectrum, as denoted by frequencies less than cutoff frequency 446. On the contrary, the frequency spectrum of cycle-to-cycle noise is located outside of the audio frequency spectrum, as denoted by frequencies greater than cutoff frequency 446.

FIG. 4D illustrates a noise frequency spectrum 408 of digital signal e(n), where e(n) represents value of error at a discrete time n. The signal e(n) may be represented as the jitter signal x(n)−x(n−1) as depicted in the frequency domain in FIG. 4B multiplied by the clock signal error $\Delta t/T_{clk}$ as depicted in the frequency domain in FIG. 4C as shown below:

$$e(n) = (x(n) - x(n-1)) \cdot (\Delta t(n)/T_{clk}).$$

Multiplication of two signals in the time domain may be represented in the frequency domain by performing a mathematical convolution of the two frequency domain representations of the signals. Performing a convolution of the frequency domain representations of (x(n)−x(n−1)) and ($\Delta t(n)/T_{clk}$) in results in the following equation:

$$E(z) = ((1-z^{-1}) \cdot X(z)) \cdot F_{clk} \otimes Pn(z).$$

The symbol $\otimes$ above represents convolution of $((1-z^{-1}) \cdot X(z)) \cdot F_{clk}$ with $Pn(z)$ to generate $E(z)$, where $E(z)$ represents conversion of e(n) to the frequency domain, $((1-z^{-1}) \cdot X(z))$ represents the conversion of (x(n)−x(n−1)) to the frequency domain, $F_{clk}$ represents conversion of $1/T_{clk}$ to the frequency domain and $Pn(z)$ represents conversion of $\Delta t(n)$ to the frequency domain. Performing the convolution operation above may also be represented as convolving jitter error frequency spectrum 404 of FIG. 4B with clock signal error frequency spectrum 406 of FIG. 4C. Noise frequency spectrum 408 of FIG. 4D represents the result of the operation of convolving FIG. 4B with FIG. 4C.

FIG. 4D illustrates why using a lower frequency clock for generation of analog audio as illustrated by reference clock signal 108 in FIG. 2 results in poorer quality audio over the configuration as illustrated when using audio clock signal 112 in FIG. 1 for generation of analog audio, even though the clock signal jitter produced by reference clock signal 108 of FIG. 2 is less than the clock signal jitter produced by audio clock signal 112 of FIG. 1. In performing the convolution of FIG. 4B with FIG. 4C, it is demonstrated that the lower the clock signal frequency, the more the long term jitter noise frequency spectrum 444 of FIG. 4C becomes a negative factor, i.e. less signal-to-noise ratio and less fidelity, in the audio frequency spectrum as denoted by frequencies less than a cutoff frequency.

FIG. 4D has a y-axis 454 with dimensions of magnitude and units of volts squared and an x-axis 456 with dimensions of frequency and units of Hz. The frequency range for x-axis 456 includes frequencies from 0 Hz increasing up to the frequency used to sample the audio divided by 2 which is denoted as a divided sample frequency 458.

A noise skirt frequency spectrum 460 initiates at a frequency of 0 Hz on x-axis 456 and terminates as a cutoff frequency 462 on x-axis 456. Noise skirt frequency spectrum 460 has a maximum magnitude at a maximum 464. A jitter noise frequency spectrum 466 initiates at cutoff frequency 462 and increases monotonically until it reaches divided sample frequency 458 on x-axis 456. A noise floor 468 is located at cutoff frequency 462.

Ideal DAC frequency spectrum 402 of FIG. 4A represents a frequency spectrum for a perfect rendition of a digital audio signal as presented by waveform 300 as illustrated in FIG. 3. However, due to errors induced as a result of clock signal jitter in the conversion of the digital audio information to analog as produced by the conventional circuits of FIG. 1 and FIG. 2 and as illustrated in FIG. 3 by waveform 300, waveform 302 and waveform 304, the actual audio spectrum generated include the effects of jitter is illustrated in FIG. 4B.

As illustrated in FIG. 4A-B, the magnitude of output signal spectrum 430 of FIG. 4B is less than the magnitude of output signal spectrum 416 of FIG. 4A. Furthermore, jitter noise frequency spectrum 436 of FIG. 4B is a larger magnitude than that of cycle-to-cycle noise frequency spectrum 422 of FIG. 4A. As a result, the signal-to-noise ratio for ideal DAC frequency spectrum 402 of FIG. 4A is greater than the signal-to-noise ratio of jitter error frequency spectrum 404 of FIG. 4B. The cause of the degraded signal-to-noise ratio of jitter error frequency spectrum 404 as compared to ideal DAC frequency spectrum 402 is a result of experiencing clock signal jitter as discussed previously with respect to FIG. 1, FIG. 2 and FIG. 3.

Clock signal error frequency spectrum 406 represents the frequency spectrum as related to clock signal jitter. Clock signal error frequency spectrum 406 is basically composed of two elements: noise within the frequency band of interest, i.e. frequencies less than cutoff frequency 446, as represented by long term jitter noise frequency spectrum 444 and noise external to the frequency band of interest, i.e. frequencies less than cutoff frequency 446, as represented by cycle-to-cycle noise frequency spectrum 450.

In the time-domain, a signal and its respective jitter noise may be multiplied by any related clock signal noise to determine the resulting output of a circuit. A corresponding operation may be performed in the z-domain or frequency domain by performing a convolution of the frequency spectrum of the signal and its related jitter noise with the frequency spectrum of any related clock signal noise to realize the frequency spectrum for the output of a circuit. Noise frequency spectrum 408 of FIG. 4D is the result of performing a convolution of jitter error frequency spectrum 404 of FIG. 4B with clock signal error frequency spectrum 406 of FIG. 4C.

As illustrated by noise frequency spectrum 408 of FIG. 4D, noise skirt frequency spectrum 460 is present in the frequency band of interest resulting in the degradation of the signal-to-noise ratio of the output signal. Furthermore, the noise floor is elevated as illustrated by noise floor 468. The degradation in signal-to-noise ratio and the increase in the noise floor as illustrated by noise frequency spectrum 408 are a result of clock signal jitter.

A discussion associated with comparing the conventional circuits of FIG. 1 and FIG. 2 as related to clock signal phase noise will now be discussed with respect to FIG. 5.

FIG. 5 illustrates a graph of a comparison of phase noise versus frequency for the conventional circuits illustrated in FIG. 1 and FIG. 2.

A graph 500 includes a y-axis 502 with dimensions of phase noise and units of dB and an x-axis 504 with dimensions of frequency and units of Hertz.

A dashed line high frequency clock signal phase noise spectrum 506 initiates with a phase noise of approximately −100 dB at a frequency of 20 Hz on x-axis 504 and increases monotonically up to a dashed line maximum 508 with a phase noise of approximately −80 dB and at approximately a frequency of 10 KHz. Dashed line high frequency clock signal phase noise spectrum 506 decreases monotonically from approximately 10 KHz on x-axis 504 with a corresponding phase noise of approximately −78 dB to 20 KHz on x-axis 504 with a corresponding phase noise of approximately −79 dB.

A dotted line low frequency clock signal phase noise spectrum 510 initiates with a phase noise of approximately −20 dB at a frequency of 20 Hz on x-axis 504 and decreases monotonically to approximately 20 KHz on x-axis 504 with a corresponding phase noise of approximately −79 dB.

Dashed line high frequency clock signal phase noise spectrum 506 and dotted line low frequency clock signal phase noise spectrum 510 converge at a frequency of approximately 20 KHz on x-axis 504 with a corresponding phase noise on y-axis 502 of approximately −79 dB.

Dashed line high frequency clock signal phase noise spectrum 506 corresponds with the conventional circuit as illustrated in FIG. 1. Dotted line low frequency clock signal phase noise spectrum 510 corresponds to the conventional circuit as illustrated in FIG. 2.

As illustrated in FIG. 5, the phase noise for the convention circuit of FIG. 2 as illustrated by dotted line low frequency clock signal phase noise spectrum 510 is greater than the phase noise of the conventional circuit of FIG. 1 as illustrated by dashed line high frequency clock signal phase noise spectrum 506. Even though the clock signal jitter generated on reference clock signal 108 by digital oscillator 106 of FIG. 2 is less than the clock signal jitter generated on audio clock signal 112 by audio PLL 110 of FIG. 1, the phase noise generated by the circuit of FIG. 2 is greater than the phase noise generated by the circuit of FIG. 1. The increase in phase noise is a result of the lower clock signal frequency of reference clock signal 108 as generated by digital oscillator 106 of FIG. 1 as compared to the higher clock signal frequency of audio clock signal 112 as generated by audio PLL 110 in FIG. 2.

FIG. 6 illustrates a graph of a comparison of ideal audio signal spectrum versus frequency for the conventional circuits illustrated in FIG. 1 and FIG. 2.

FIG. 6 illustrates a graph of a comparison between using a low frequency clock signal versus a high frequency clock signal for an ideal audio signal spectrum.

A graph 600 includes a y-axis 602 with dimensions of magnitude and units of dB and a x-axis 604 with dimensions of frequency and units of Hz.

A dashed line high frequency clock signal noise spectrum 606 initiates at x-axis 604 frequency of 100 Hz and y-axis 602 magnitude of approximately −139 dB and increases monotonically to a dashed line maximum 608 located at x-axis 604 frequency of approximately 10 KHz and y-axis 602 magnitude of approximately −129 dB. Dashed line high frequency clock signal noise spectrum decreases monotonically from dashed line maximum 608 to x-axis 604 frequency of 20 KHz and a corresponding y-axis 602 magnitude of approximately −130 dB.

A dotted line low frequency clock signal noise spectrum 610 initiates at x-axis 604 frequency of 100 Hz and y-axis 602 magnitude of approximately −97 dB and increases monotonically to a dotted line maximum 612. Dotted line maximum 612 is located at approximately x-axis 604 frequency of 1 KHz and a corresponding y-axis 602 magnitude of −71 dB. Dotted line low frequency clock signal noise spectrum 610 decreases monotonically from dotted line maximum 612 to x-axis 604 frequency of 20 KHz and a corresponding y-axis 602 magnitude of approximately −130 dB.

A solid line DAC output signal spectrum 614 initiates approximately at a x-axis frequency of 700 KHz and a corresponding y-axis 602 magnitude of −180 dB and increases monotonically to a solid line lower lobe maximum 616. Solid line lower lobe maximum 616 is located at approximately x-axis 604 frequency 800 KHz and a corresponding y-axis 602 magnitude of −175 dB. Solid line DAC output signal spectrum 614 decreases monotonically from solid line lower lobe maximum 616 to approximately x-axis 604 frequency 850 KHz and a corresponding y-axis 602 magnitude of −180 dB. Solid line DAC output signal spectrum 614 increases monotonically from approximately x-axis frequency 850 KHz and y-axis magnitude of −180 dB to a solid line maximum 618. Solid line maximum 618 is located approximately at an x-axis frequency of 1 KHz and y-axis 602 magnitude of −5 dB. Solid line DAC output signal spectrum 614 decreases monotonically from solid line maximum 618 to x-axis frequency 1150 Hz and y-axis magnitude of −180 dB.

Dotted line low frequency clock signal noise spectrum 610 represents the noise frequency spectrum as generated by the conventional circuit of FIG. 2. Dashed line high frequency clock signal noise spectrum represents the noise frequency spectrum as generated by the conventional circuit of FIG. 1. Solid line DAC output signal spectrum 614 represents the signal frequency spectrum as generated by the conventional circuits of FIG. 1 and FIG. 2. The signal-to-noise ratio with dashed line high frequency clock signal noise spectrum 606 is improved over the signal-to-noise ratio with dotted line low frequency clock signal noise spectrum 610. Even though the clock signal jitter generated on reference clock signal 108 by digital oscillator 106 of FIG. 2 is less than the clock signal jitter generated on audio clock signal 112 by audio PLL 110 of FIG. 1, the signal-to-noise ratio for the circuit of FIG. 2 is less than the signal-to-noise ratio for the circuit of FIG. 1.

FIG. 7 is a modification of the conventional circuit shown in FIG. 1 and illustrates a conventional circuit for converting digital audio information to analog using a single PLL for system clock signal and audio clock signal.

A circuit 700 includes elements of FIG. 1 except audio PLL 110 has been removed.

Audio signal generator portion 120 and DAC 130 receive system clock signal 115 generated by system PLL 114.

Audio signal generator portion 120 uses system PLL 114 for synchronizing its operation for generation of digital audio signal 121. Audio signal generator portion 120 processes digital audio information at a speed of execution with respect to system clock signal 115. Typically digital audio information is stored in a compressed format and a function performed by digital audio decompression portion 118 is to convert the compressed digital audio information received on compressed digital audio signal 117 generated by compressed digital audio source 116 into decompressed digital audio information as represented by decompressed digital audio signal 119. The digital information processed by audio signal generator portion 120 is denoted as digital audio signal 121 and is supplied to interpolator 122.

The digital audio information to be supplied by circuit 700 may be of a higher frequency than supplied by audio signal generator portion 120. Interpolator 122 functions to create digital audio information which is an estimate based on digital audio signal 121. For example, the audio information delivered by audio signal generator portion 120 in digital audio signal 121 might be supplied at a rate of 8 KHz. However, the audio information supplied by circuit 700 might be at a rate of 16 KHz. Interpolator 122 may function to insert estimated audio data between each actual audio data.

The output audio information as processed by interpolator 122 is denoted as interpolated signal 124. Interpolated signal 124 is received by noise shaping portion 126. The function of noise shaping portion 126 is to process and move audio noise from one frequency band to a different frequency band. Typically, noise shaping portion 126 converts audio noise generated in a frequency band which is perceptible by the human ear to audio noise in a frequency band which is less perceptible by the human ear.

The output signal as processed by noise shaping portion 126 is denoted as shaped signal 128. DAC 130 receives shaped signal 128. DAC 130 converts digitized data as received by shaped signal 128 and supplies an analog or continuous electrical signal as denoted as analog signal 132. Analog signal 132 is an output signal as supplied by circuit 700.

Circuit 700 is configured to use a lower performance PLL as denoted by system PLL 114 for driving or clocking DAC 130. The goals of circuit 700 is to remove a costly and power consuming high performance PLL used for driving DAC 130 and replace its function with a PLL used for clocking other circuit portions as denoted by system PLL 114. While the configuration of circuit 700 reduces the cost and power consumption of circuit 700 over other conventional circuit configurations, it also increases the induced jitter noise. The increased jitter noise is a result of using a clock signal with significant clock signal jitter to drive audio signal generator portion 120 and DAC 130. The increased clock signal jitter is a result of using a low quality PLL. As discussed previously, the increased clock signal jitter noise reduces the fidelity of the audio as produced by circuit 700 as compared to a conventional circuit with a lower amount of clock signal jitter noise.

The previous discussion has illustrated the trade-offs involved in the conventional conversion of digital audio information to its analog representation. As illustrated in FIG. 1, the fidelity of a digital-to-analog conversion can be increased by using a high-performance PLL, but at the expense of increased cost and power consumption. As illustrated in FIG. 2, a clock signal generated by a digital oscillator with a lower frequency and lower clock signal jitter may be used to decrease the clock signal jitter noise, but an increase in phase noise is experienced which results in a low fidelity digital-to-analog conversion. As illustrated in FIG. 7, a higher frequency clock signal can be generated from a PLL used for other circuit portions which reduces the associated phase noise, but an increase in clock signal jitter noise by the lower quality PLL produces a low fidelity digital-to-analog conversion. What is needed is a way to perform audio digital-to-analog conversion without using a higher cost and higher power consuming high performance PLL. Furthermore, a method is needed to use existing circuitry in order to prevent higher cost, power consumption and complexity.

BRIEF SUMMARY

The present invention is drawn to a method for increasing the fidelity of converting digitized audio to its analog representation and for reducing the associated cost, power consumption and complexity.

In accordance with an aspect of the present invention, a circuit includes a digital oscillator, a PLL, a digital signal generator, a correction circuit and a DAC. The digital oscillator can output a reference clock signal. The PLL can output a system clock signal based on the reference clock signal. The digital signal generator can output a digital signal based on the system clock signal. The correction circuit can output a pre-distorted signal based on the reference clock signal, the system clock signal and the digital signal. The DAC can output an analog signal based on the pre-distorted signal and the system clock signal.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings:

FIG. 1 illustrates a conventional circuit for converting digital audio information to its analog representation;

FIG. 2 illustrates a conventional circuit for converting digital audio information to analog similar to FIG. 1 except with a PLL component removed and the clock signal for the audio processing portion of the circuit driven by a digital oscillator instead of by a PLL;

FIG. 7 is a modification of the convention circuit shown in FIG. 1 and illustrates a conventional circuit for converting digital audio information to analog using a single PLL for system clock signal and audio clock signal;

FIG. 8 illustrates an example electrical circuit in accordance with an aspect of the present invention;

DETAILED DESCRIPTION

Figure 3:
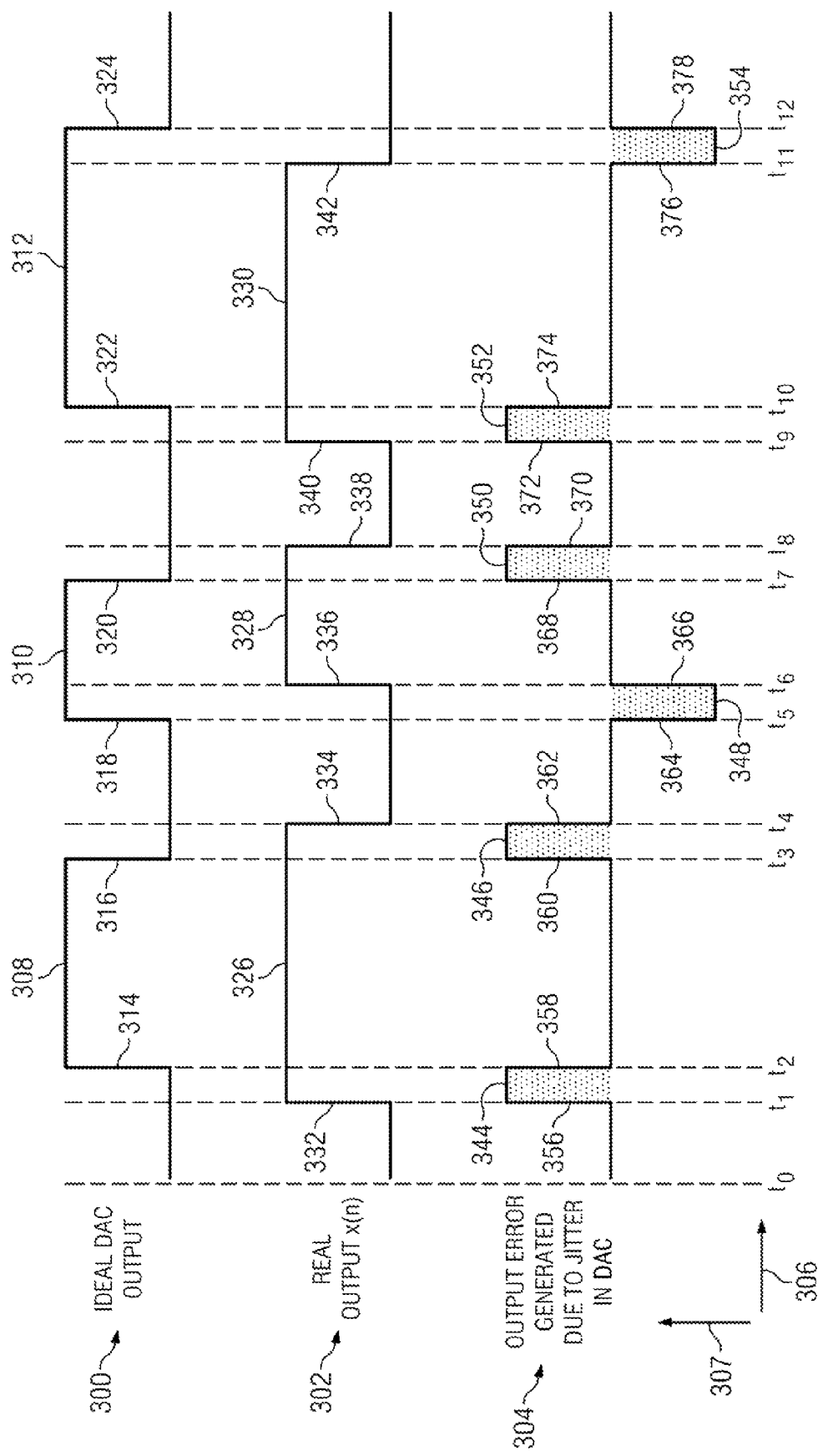
FIG. 3 illustrates a conventional actual audio waveform as generated by the conventional circuit of FIG. 1 and FIG. 2 versus an ideal audio waveform and presents an error waveform representing the difference between actual and ideal.
Figure 4A:
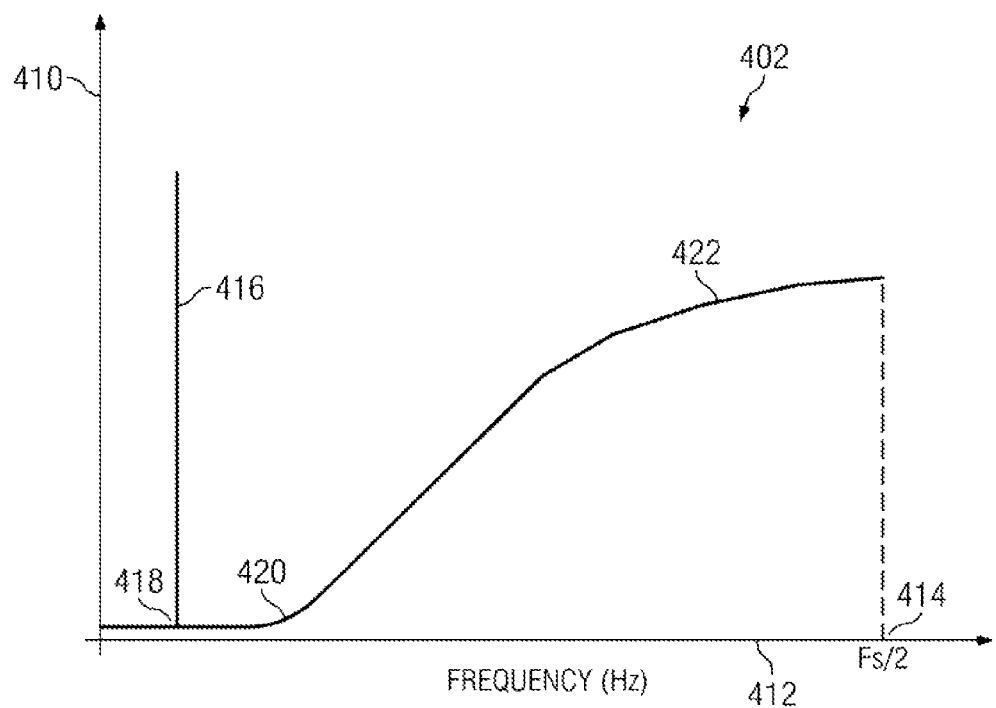
FIG. 4A-D illustrates conventional frequency spectrum graphs as generated by the conventional circuits of FIG. 1 and FIG. 2 and waveforms of FIG. 3.
Figure 4B:
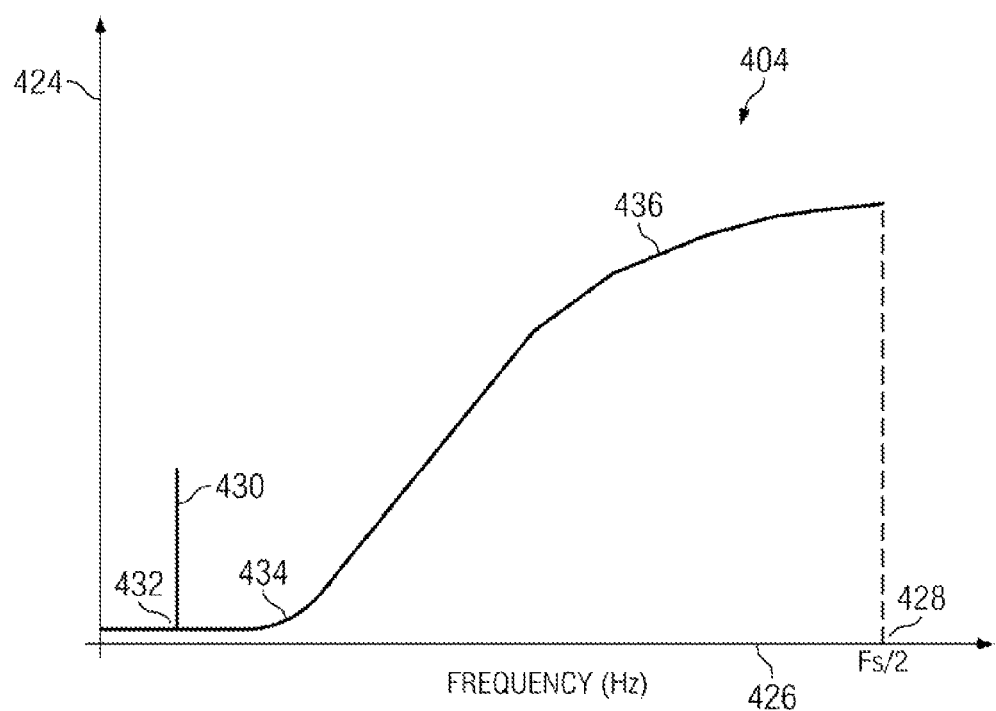
Figure 4C:
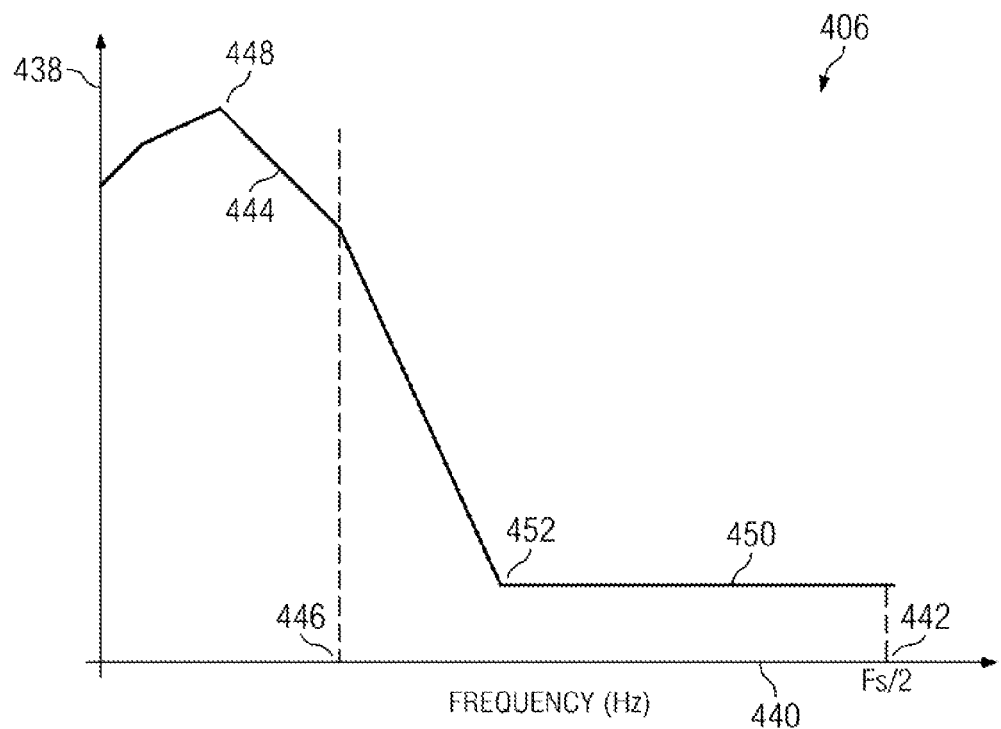
Figure 4D:
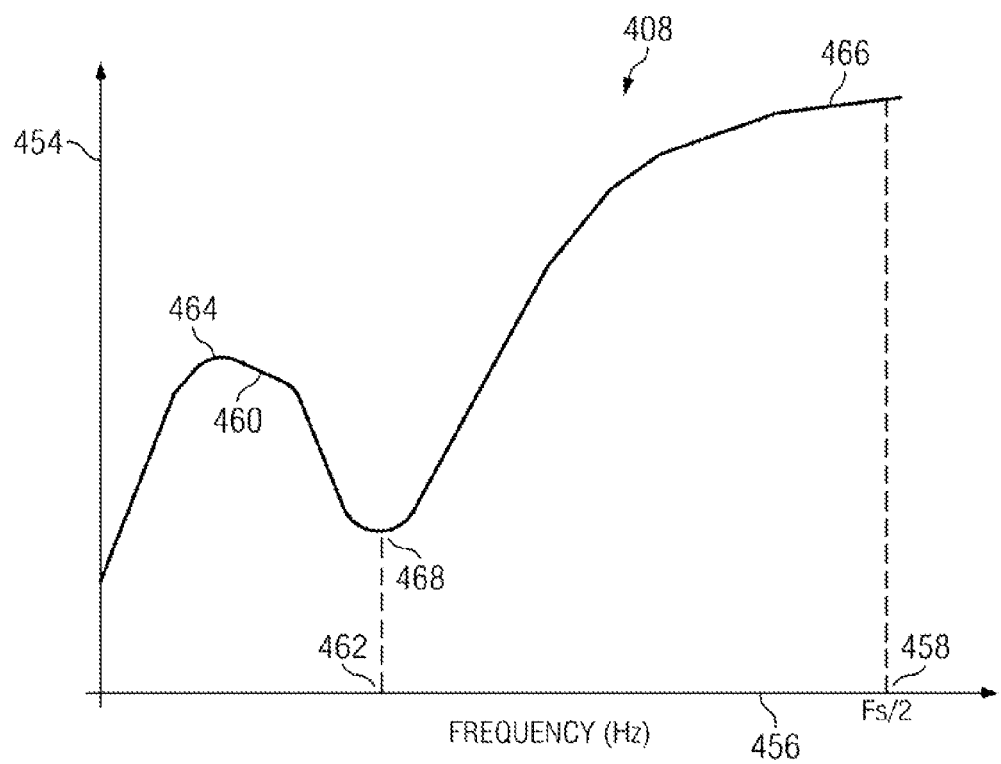
Figure 5:
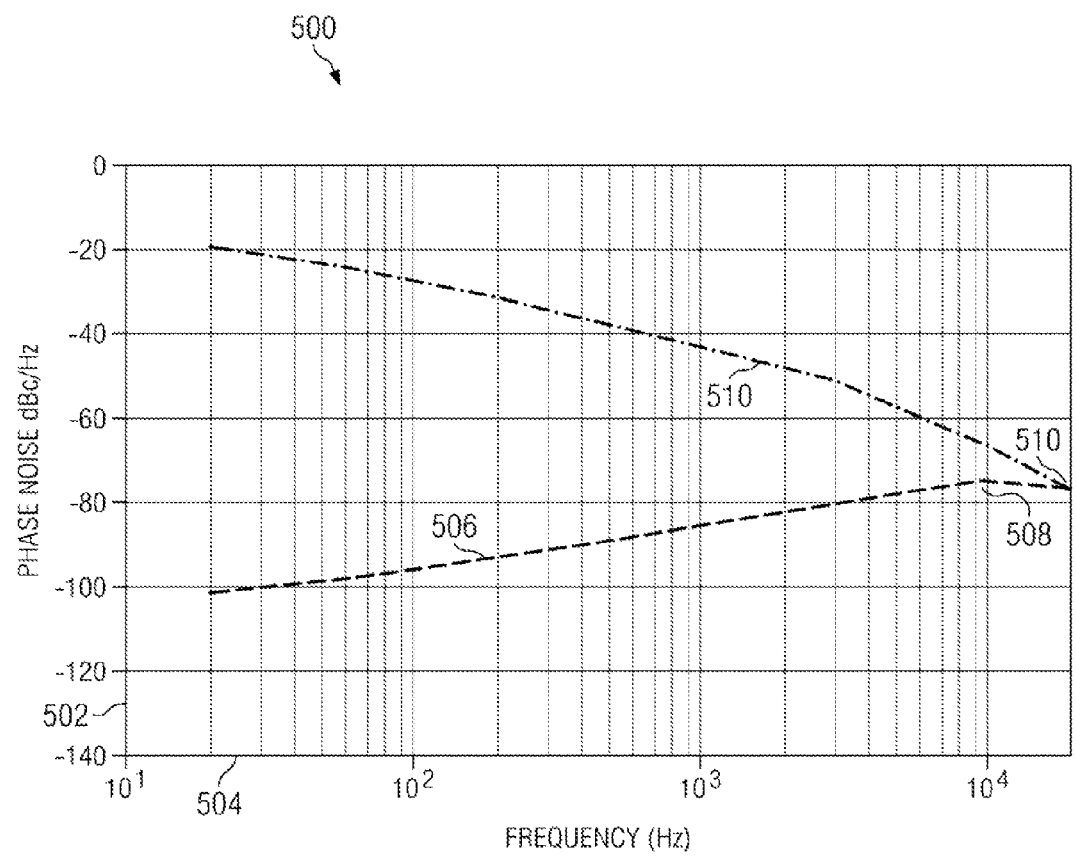
FIG. 5 illustrates a graph of a comparison of phase noise versus frequency for the conventional circuits illustrated in FIG. 1 and FIG. 2.
Figure 6:
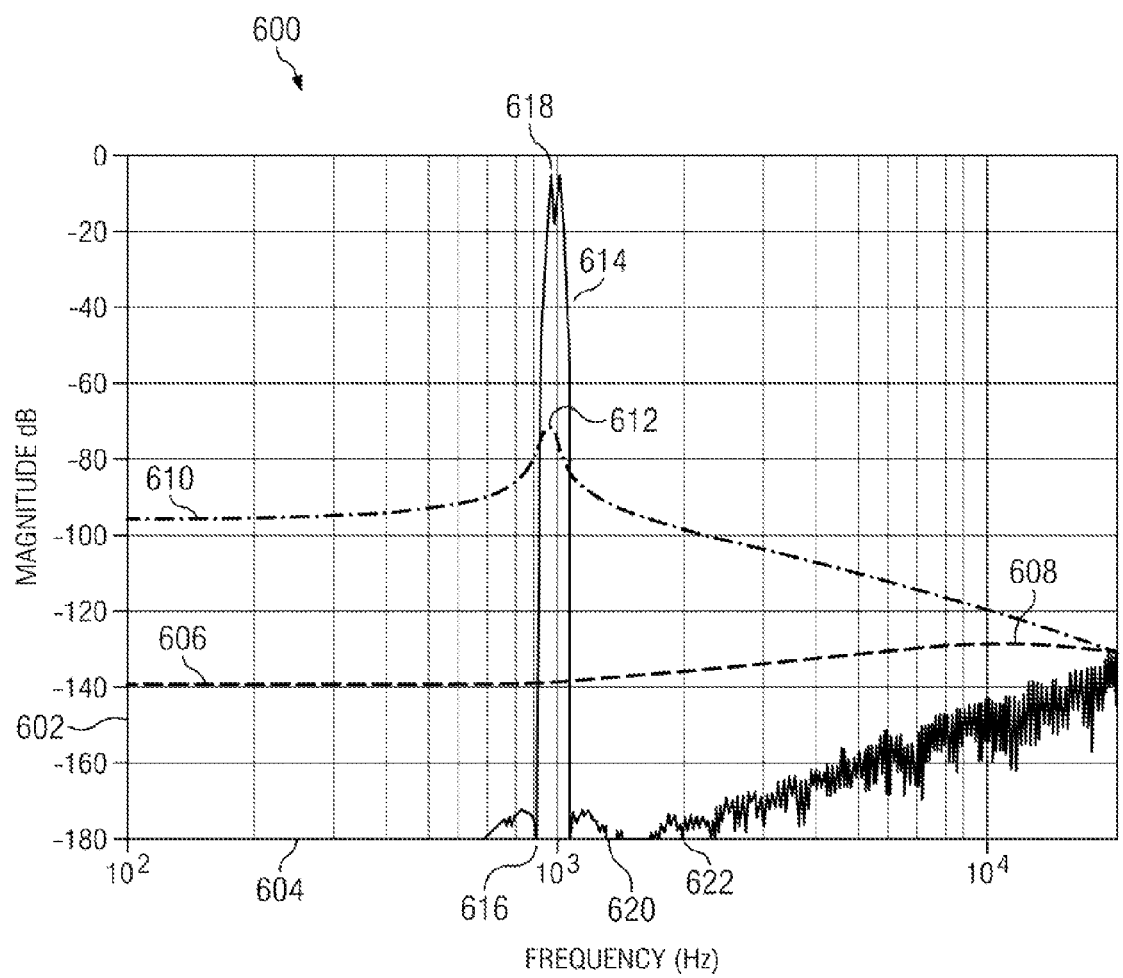
FIG. 6 illustrates a graph of a comparison of ideal audio signal spectrum versus frequency for the conventional circuits illustrated in FIG. 1 and FIG. 2.

In accordance with an example aspect of the present invention, a digital correction circuit is provided for increasing fidelity when converting a digital signal to its analog representation. The digital correction circuit includes a time-to-digital converter, a linear predictor, a mixer and a subtractor. The time-to-digital converter receives a reference clock signal from the oscillator, receives a system clock signal from a PLL and compares the two clock signals. Any difference between the reference clock signal and the system clock signal are output by the time-to-digital converter as an estimated drift signal. The system clock signal from the PLL may exhibit clock signal jitter that may otherwise negatively impact the conversion of the digital signal to its analog representation. The linear predictor, mixer, subtractor and estimated drift signal operate to filter or modify the digital audio signal into a pre-distorted signal. The pre-distorted signal is further processed by an interpolator, noise shaping portion and a DAC. The resultant output analog signal exhibits increased fidelity over conventional methodologies as a result of the cancellation of effects due to clock signal jitter.

In accordance with a first example aspect of the present invention, a pre-distortion is performed on a digital signal to correct for errors before the digital signal is transformed into an analog signal. In accordance with a second example aspect of the present invention, an analog signal is transformed into a digital signal and then post-correction is performed on the digital signal to correct for errors.

The first example aspect of the present invention will now be described with reference to FIGS. 8-10.

FIG. 8 illustrates an example circuit 800 for converting digital audio information to its analog representation in accordance with an aspect of the present invention.

As illustrated in the figure, circuit 800 includes the elements of circuit 100 of FIG. 1, with the addition of a digital correction circuit 802. Digital correction circuit 802 includes a time-to-digital converter 804 a linear predictor 806, a mixer 808 and a subtractor 810. In this example embodiment, each of time-to-digital converter 804, linear predictor 806, mixer 808 and subtractor 810 are illustrated as distinct devices. However in other example embodiments, at least one of time-to-digital converter 804, linear predictor 806, mixer 808 and subtractor 810 may be combined as a unitary device.

Digital correction circuit 802 is arranged to output a pre-distorted signal 812 based reference clock signal 108, system clock signal 115 and digital audio signal 121. In this example embodiment, digital correction circuit 802 is arranged to receive reference clock signal 108 directly from digital oscillator 106, to receive system clock signal 115 directly from system PLL 114 and to receive digital audio signal 121 directly from audio signal generator portion 120. Alternatively, intermediate circuitry may be included to modify at least one of reference clock signal 108, system clock signal 115 and digital audio signal 121 prior to digital correction circuit 802.

More specifically, in this example embodiment, time-to-digital converter 804 is arranged to output an estimated drift signal 814 based on reference clock signal 108 and system clock signal 115. In this example, time-to-digital converter 804 is arranged to receive reference clock signal 108 directly from digital oscillator 106 and to receive system clock signal 115 directly from system PLL 114. Alternatively, intermediate circuitry may be included to modify at least one of reference clock signal 108 and system clock signal 115 prior to time-to-digital converter 804.

Linear predictor 806 is arranged to output a filtered signal 816 based on digital audio signal 121. In this example, time linear predictor 806 is arranged to receive digital audio signal 121 directly from audio signal generator portion 120. Alternatively, intermediate circuitry may be included to modify digital audio signal 121 prior to linear predictor 806.

Mixer 808 is arranged to output an estimated error signal 818 based on estimated drift signal 814 and filtered signal 816. In this example, mixer 808 is arranged to receive estimated drift signal 814 directly from time-to-digital converter 804 and to receive filtered signal 816 directly from linear predictor 806. Alternatively, intermediate circuitry may be included to modify at least one of estimated drift signal 814 and filtered signal 816 prior to mixer 808.

Subtractor 810 is arranged to output pre-distorted signal 812 based on digital audio signal 121 and estimated error signal 818. In this example, subtractor 810 is arranged to receive digital audio signal 121 directly from audio signal generator portion 120 and to receive estimated error signal 818 directly from mixer 808. Alternatively, intermediate circuitry may be included to modify at least one of digital audio signal 121 and estimated error signal 818 prior to subtractor 810.

Time-to-digital converter 804 may receive and processes reference clock signal 108 and system clock signal 115 to generate estimated drift signal 814. Estimated drift signal 81.4 may be a digital signal with one or multiple bits or digits representing an estimate for an amount of drift between reference clock signal 108 and system clock signal 115. The operation of reference clock signal 108 may be demonstrated by waveform 300 in FIG. 3 and of system clock signal 115 as waveform 302 in FIG. 3. As previously discussed with respect to FIG. 3, waveform 304 is a representation of the error between waveform 300 and waveform 302. Furthermore, the clock error as illustrated by waveform 304 causes degradation of audio quality in conventional conversion of digital audio to analog. Time-to-digital converter 804 receives and processes reference clock signal 108 as represented by waveform 300 and system clock signal 115 as represented by waveform 302 and generates a digital error signal as represented by estimated drift signal 814. The value of estimated drift signal 814 is proportional to the amount of clock signal error between reference clock signal 108 and system clock signal 115, i.e. the larger the error, the larger the value of estimated drift signal 814, the smaller the error, the smaller the value of estimated drift signal 814.

Linear predictor 806 receives and processes digital audio signal 121 to generate filtered signal 816. Linear predictor 806 may perform digital signal processing algorithms for generating filtered signal 816. A linear predictor may perform a mathematical operation where future values of a discrete-time audio signal are estimated as a linear function of previous samples. An example algorithm for linear predictor 806 is $1-z^{-1}$ where $z^{-1}$ represents a unit time delay. A function of linear predictor 806 is to generate filtered signal 816 estimated clock error signal which may be mixed with estimated drift signal 814 for producing pre-distorted signal 812 which when processed by interpolator 122, noise shaping portion 126 and DAC 130 may produce a digital signal which has significantly less distortion as compared to a convention system for converting digital audio to analog.

Mixer 808 receives and processes estimated drift signal 814 and filtered signal 816 to generate estimated error signal 818. Mixer 808 may perform a multiplication operation for generating estimated error signal 818. Estimated error signal 818 represents an estimated value of the error which may be introduced into converting digital audio to analog as a result of clock signal error. Clock signal error may be a result of differences between the clock edges for reference clock signal 108 and system clock signal 115. The differences which may occur between reference clock signal 108 and system clock signal 115 are a result of the inherent clock signal jitter produced by PLLs. Typically, a function of mixer 808 is to combine estimated drift signal 814 with filtered signal 816 which when subtracted from the actual digital audio signal as represented by digital audio signal 121 may produce a pre-distorted signal which when processed by interpolator 122, noise shaping portion 126 and DAC 130 may produce a digital signal which has significantly less distortion as compared to a convention system for converting digital audio to analog.

Subtractor 810 receives and processes estimated error signal 818 and digital audio signal 121 to generate pre-distorted signal 812. Typically, subtractor 810 performs a subtraction operation for generating pre-distorted signal 812. A function of subtractor 810 is to subtract an estimate for the amount of distortion which may be injected as a result of clock signal jitter error from the actual audio signal which when processed by interpolator 122, noise shaping portion 126 and DAC 130 may produce a digital signal which has significantly less distortion as compared to a convention system for converting digital audio to analog.

Interpolator 122 is arranged to receive pre-distorted signal 812 and to output interpolated signal 124. The digital audio information to be supplied by circuit 800 may need to have a higher frequency than the frequency of pre-distorted signal 812. Interpolator 122 creates digital audio information, which is an estimate based on pre-distorted signal 812. For example, audio data within pre-distorted signal 812 might have been sampled at a frequency of 8 KHz, whereas the audio data to be supplied by circuit 800 might be required to have a sampling frequency of 16 KHz. Interpolator 122 may function to insert estimated audio data between the actual sampled audio data within pre-distorted signal 812 to generate interpolated signal 124.

Noise shaping portion 126 is arranged to receive interpolated signal 124 and to output shaped signal 128. Noise shaping portion 126 is operable to remove high frequency portions of interpolated signal 124 to reduce distortion within interpolated signal 124 in order to generate shaped signal 128.

DAC 130 is arranged to receive system clock signal 115 and shaped signal 128 and to output analog signal 132. The output signal as processed by noise shaping portion 126 is denoted as shaped signal 128. DAC 130 converts shaped signal 128, which is a digital signal, to analog signal 132, to be output by circuit 800.

Digital correction circuit 802 operates to filter or modify digital audio signal 121 in such a way as to compensate for errors, such as induced by clock signal jitter, as produced by system PLL 114 and injected into system clock signal 115. The filtered or modified signal is represented by pre-distorted signal 812. System PLL 114 is a lower quality PLL typically used in conventional systems for driving or clocking circuitry not related to DAC 130. In a conventional configuration, a clock signal generated by system PLL 114 exhibits sufficient clock signal jitter to render a low fidelity signal at the output of a digital-to-analog converter. For this embodiment of the present invention, system clock signal 115 drives or clocks audio signal generator portion 120 and also DAC 130. As was illustrated for the conventional circuit of FIG. 7, clocking or driving audio signal generator portion 120 and DAC 130 with a clock sourced from system PLL 114 results in clock signal jitter being introduced into a digital-to-analog circuit and results in a low fidelity digital-to-analog conversion. However, digital correction circuit 802, an example embodiment of the present invention, operates to filter or compensate digital audio signal 121 such that the process of feeding pre-distorted signal 812 into interpolator 122, noise shaping portion 126 and DAC 130 results in a high fidelity analog signal 132.

Further discussion will now be presented in order to further explain the operation of the example embodiment of the present invention as illustrated in FIG. 8.

Figure 9:
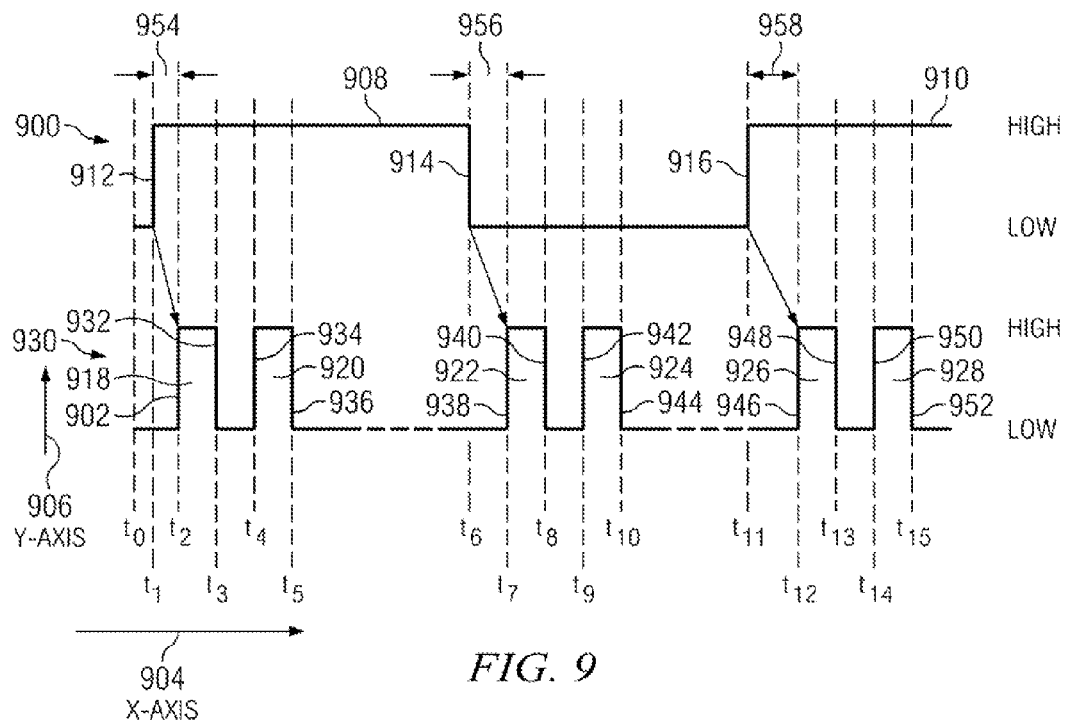
FIG. 9 illustrates a comparison of two clock signals processed by an example embodiment of the present invention as illustrated in FIG. 8.

FIG. 9 illustrates a comparison of two clocks processed by an example embodiment of the present invention as illustrated in FIG. 8.

FIG. 9 includes a waveform 900 and a waveform 902. Waveform 900 represents example reference clock signal 108 from digital oscillator 106 and waveform 902 represents system clock signal 115 from system PLL 114.

An x-axis 904, which is shared by each of waveform 900 and waveform 902, represents units of time. An y-axis 906 represents voltage.

Waveform 900 starts at time $t_0$ and includes a pulse 908 and a pulse 910. Pulse 908 is positive in voltage and has a rising edge 912 at time $t_1$ and a falling edge 914 at time $t_6$. Pulse 910 is positive in voltage and has a rising edge 916 at time $t_{11}$ and remains a positive voltage throughout the remainder of time as represented by x-axis 904.

Waveform 902 starts at a time $t_0$ and includes a pulse 918, a pulse 920, a pulse 922, a pulse 924, a pulse 926 and a pulse 928. Pulse 918 is positive in voltage and has a rising edge 930 at a time $t_2$ and a falling edge 932 at time $t_3$. Pulse 920 is positive in voltage and has a rising edge 934 at a time $t_4$ and a falling edge 936 at time $t_5$. Pulse 922 is positive in voltage and has a rising edge 938 at a time $t_7$ and a falling edge 940 at time $t_8$. Pulse 924 is positive in voltage and has a rising edge 942 at a time $t_9$ and a falling edge 944 at time $t_{10}$. Pulse 926 is positive in voltage and has a rising edge 946 at a time $t_{12}$ and a falling edge 948 at time $t_{13}$. Pulse 928 is positive in voltage and has a rising edge 950 at a time $t_{14}$ and a falling edge 952 at time $t_{15}$.

The clock frequency of reference clock signal 108, as illustrated by waveform 900, is lower than the clock frequency of system clock signal 115 as illustrated by waveform 902. The time difference between rising edge 912 of reference clock signal 108 and rising edge 930 of system clock signal 115 is denoted as a delay 954. The time difference between falling edge 914 of reference clock signal 108 and rising edge 938 of system clock signal 115 is denoted as a delay 956. The time difference between rising edge 916 of reference clock signal 108 and rising edge 946 of system clock signal 115 is denoted as a delay 958.

As illustrated in FIG. 8, time-to-digital converter 804 receives system clock signal 115 and reference clock signal 108. Time-to-digital converter 804 uses these input clock signals for generating a digital signal representing an estimated drift between the system clock signal 115 and reference clock signal 108 and is represented as estimated drift signal 814. For example, the larger the value of delay 954, 956 and 958, the larger the value estimated drift signal 814 will be. Conversely, the smaller the value of delay 954, 956 and 958, the smaller the value estimated drift signal 814 will be.

The second example aspect of the present invention will now be described with reference to FIG. 10.

Figure 10:
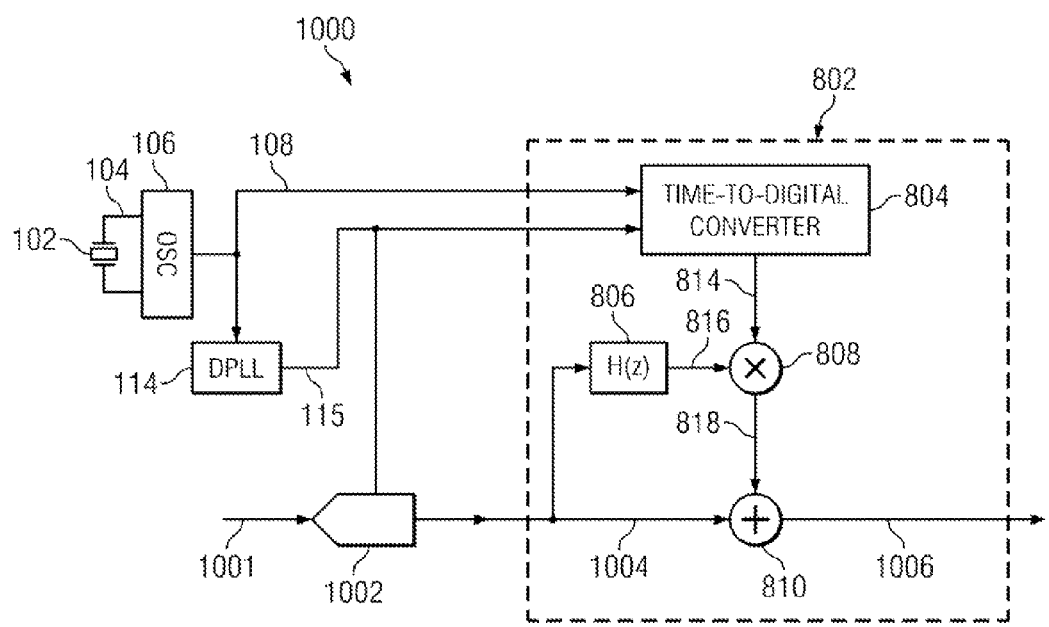
FIG. 10 illustrates another example electrical circuit in accordance with another aspect of the present invention.

FIG. 10 illustrates an example circuit 1000 for converting analog audio information to its digital representation in accordance with an aspect of the present invention.

As illustrated in the figure, circuit 1000 includes crystal 102, digital oscillator 106, system PLL 114, an analog-to-digital converter (ADC) ADC 1002 and digital correction circuit 802. In this example embodiment, each of time-to-digital crystal 102, digital oscillator 106, system PLL 114, ADC 1002 and digital correction circuit 802 are illustrated as distinct devices. However in other example embodiments, at least one of time-to-digital crystal 102, digital oscillator 106, system PLL 114, ADC 1002 and digital correction circuit 802 may be combined as a unitary device.

ADC 1002 is arranged to receive an analog audio signal 1001 and output a digital audio signal 1004 based on analog audio signal 1001. Analog audio signal 1001 may be provided by any source (not shown), a non-limiting example of which includes an audio analog engine. ADC 1002 converts analog audio signal 1001 into a digital representation as digital audio signal 1004. Therefore, in this example, ADC 1002 is a digital signal generator.

Linear predictor 806 is arranged to output filtered signal 816 based on digital audio signal 1004. In this example, time linear predictor 806 is arranged to receive digital audio signal 1004 directly from ADC 1002. Alternatively, intermediate circuitry may be included to modify digital audio signal 1004 prior to linear predictor 806.

Subtractor 810 is arranged to output a post-corrected signal 1006 based on digital audio signal 1004 and estimated error signal 818. In this example, subtractor 810 is arranged to receive digital audio signal 1004 directly from ADC 1002 and to receive estimated error signal 818 directly from mixer 808. Alternatively, intermediate circuitry may be included to modify, at least one of digital audio signal 1004 and estimated error signal 818 prior to subtractor 810.

Linear predictor 806 receives and processes digital audio signal 1004 to generate filtered signal 816. Mixer 808 receives and processes estimated drift signal 814 and filtered signal 816 to generate estimated error signal 818. Mixer 808 may perform a multiplication operation for generating estimated error signal 818. In this example, estimated error signal 818 represents an estimated value of the error which may have been introduced while converting analog audio to digital. Typically, a function of mixer 808 is to combine estimated drift signal 814 with filtered signal 816, which when subtracted from the actual digital audio signal as represented by digital audio signal 1004, may produce post-corrected signal 1006, which has significantly less distortion as compared to a convention system for converting analog audio to digital. Subtractor 810 receives and processes estimated error signal 818 and digital audio signal 1004 to generate post-corrected signal 1006.

Digital correction circuit 802 operates to filter or modify digital audio signal 1004 in such a way as to compensate for errors, such as induced by ADC 1002. The filtered or modified signal is represented by post-corrected signal 1006. For this embodiment of the present invention, system clock signal 115 drives or clocks ADC 1002. Digital correction circuit 802 in accordance with an example embodiment of the present invention, operates to filter or compensate for digital audio signal 1004 such that post-corrected signal 1006 is a high fidelity digital signal.

In accordance with the second example aspect of the present invention, a digital correction circuit provides a post-correction method for increasing the fidelity after converting an analog audio signal to its digital representation. The digital correction circuit operates to generate a post-corrected signal to cancel the effects of clock signal jitter. A high fidelity digital signal exhibiting high signal-to-noise ratio and low THD is generated as a result of applying the example embodiment of the present invention.

Further discussion will now be presented in order to further explain the operation of the example embodiment of the present invention as illustrated in FIG. 8. A comparison will be illustrated in FIG. 11 and FIG. 12 between an audio signal spectrum generated by a conventional circuit (FIG. 11) and an audio signal spectrum generated by an example embodiment of the present invention (FIG. 12).

Figure 11:
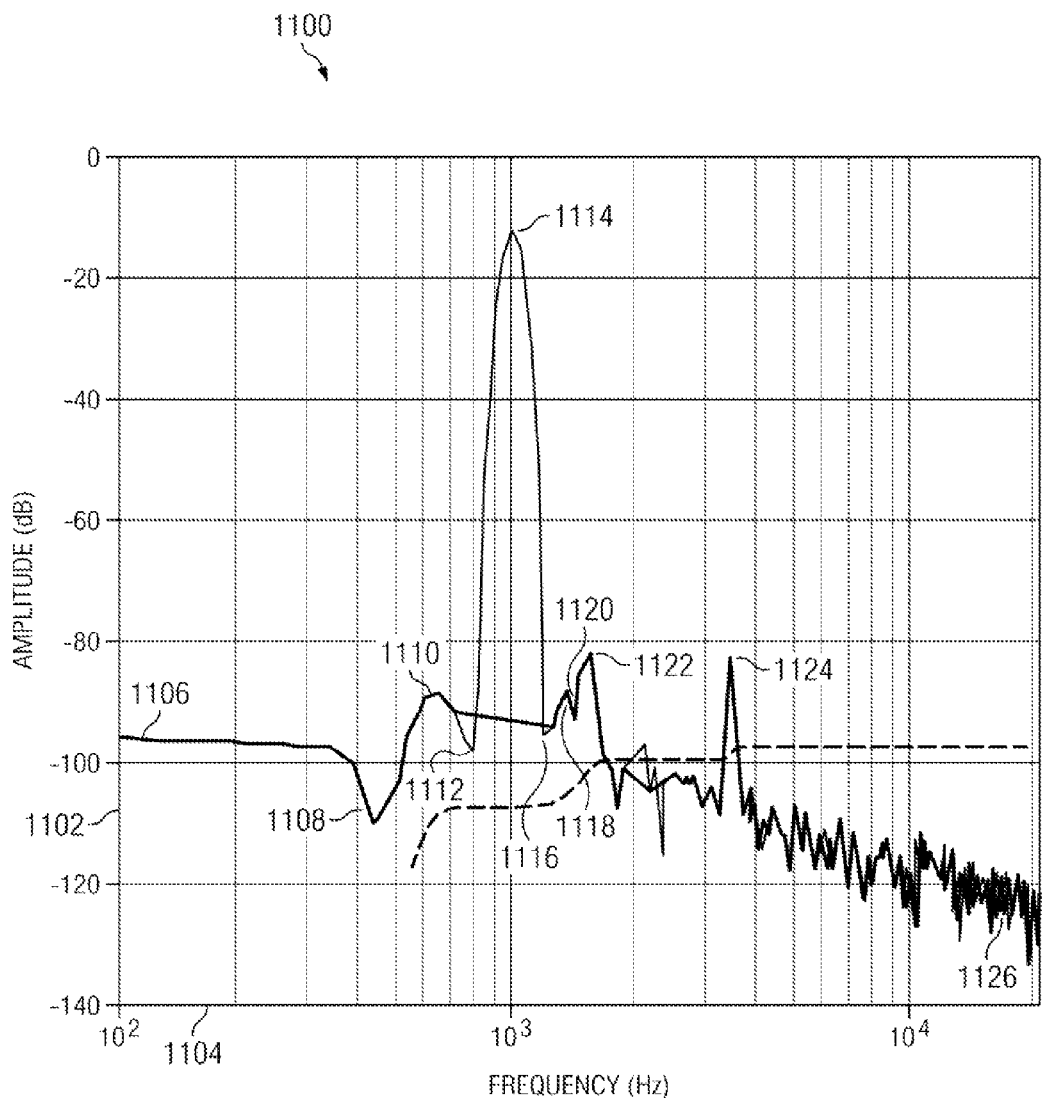
FIG. 11 illustrates the frequency spectrum for a conventional audio signal spectrum using the conventional circuit of FIG. 2 and FIG. 7.
Figure 12:
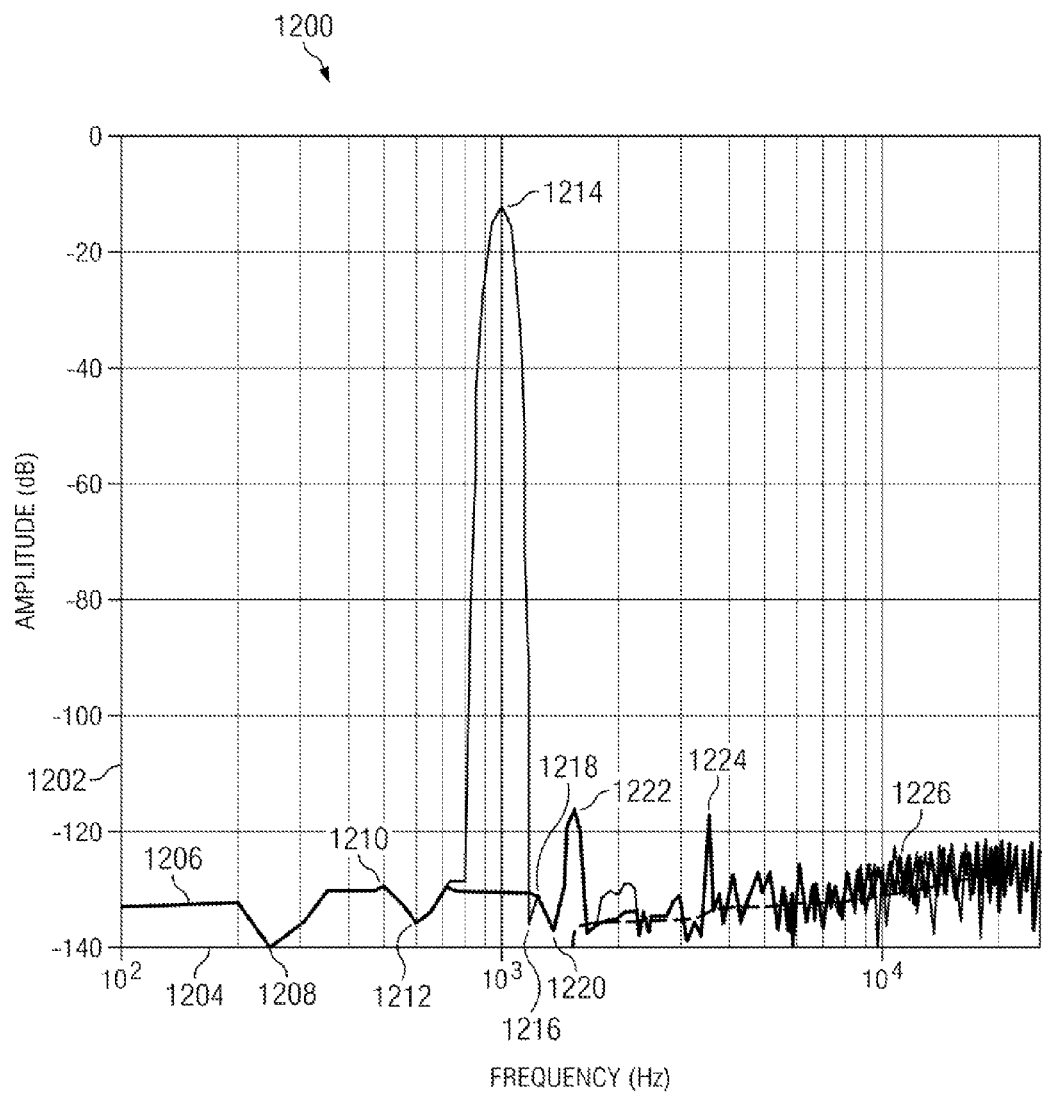
FIG. 12 illustrates the frequency spectrum for an audio signal spectrum using an example embodiment of the present invention as illustrated in FIG. 8.

FIG. 11 illustrates the frequency spectrum for a conventional audio signal spectrum using the conventional circuit of FIG. 2 and FIG. 7.

A graph 1100 includes a y-axis 1102 with dimensions of amplitude and units of dB and an x-axis 1104 with dimensions of frequency and units of Hz.

A DAC output signal spectrum 1106 initiates at x-axis 1104 frequency of 100 Hz and a corresponding y-axis 1102 amplitude of approximately −96 dB and decreases monotonically until it reaches an in-band minimum 1108. In-band minimum 1108 occurs approximately at x-axis 1104 frequency of 450 Hz and a corresponding y-axis 1102 amplitude of −110 dB.

DAC output signal spectrum 1106 increases monotonically from in-band minimum 1108 to a lower side lobe maximum 1110 located approximately at x-axis 1104 frequency of 650 Hz and a corresponding y-axis 1102 amplitude of −88 dB. DAC output signal spectrum 1106 decreases monotonically from lower side lobe maximum 1110 to a local minimum 1112 located at approximately x-axis 1104 frequency of 800 Hz and a corresponding y-axis amplitude of −99 dB. DAC output signal spectrum 1106 increases monotonically from local minimum 1112 to a maximum 1114 located approximately at x-axis 1104 frequency of 1 KHz and a corresponding y-axis 1102 amplitude of −12 dB.

DAC output signal spectrum 1106 decreases monotonically from maximum 1114 to a local minimum 1116 located at approximately x-axis 1104 frequency of 1200 Hz and a corresponding y-axis 1102 amplitude of −96 dB. DAC output signal spectrum 1106 increases monotonically from local minimum 1116 to an upper side lobe maximum 1118 located at approximately x-axis 1104 frequency of 1000 Hz and at a corresponding y-axis 1102 amplitude of −88 dB. DAC output signal spectrum 1106 decreases monotonically from upper side lobe maximum 1118 to a local minimum 1120 located approximately at x-axis 1104 frequency of 1300 Hz and corresponding y-axis 1102 amplitude of −92 dB. DAC output signal spectrum 1106 generally decreases from local minimum 1120 to x-axis 1104 frequency of 20 KHz and an approximate y-axis 1102 amplitude of −130 dB. The region from local minimum 1120 to x-axis 1104 frequency of 20 KHz predominantly contains spurious intermodulation and quantization noise, as denoted by a spurious intermodulation 1122, a spurious intermodulation 1124 and a quantization noise 1126, respectively. Spurious intermodulation 1122 occurs at approximately x-axis 1104 frequency of 1500 Hz and a corresponding y-axis 1102 amplitude of −82 dB. Spurious intermodulation 1124 occurs approximately at x-axis 1104 frequency of 3500 Hz and a corresponding y-axis 1102 amplitude of −82 dB.

As illustrated in FIG. 11, the signal-to-noise ratio realized by the conventional circuits of FIG. 2 and FIG. 7 is 65.71 dB. The exhibited signal-to-noise ratio is of sufficient quality to be enjoyed by a person, but is not considered a high fidelity signal-to-noise ratio. Furthermore, spurious intermodulation spikes resulting from clock signal jitter are exhibited in the audio frequency band and negatively impact Total Harmonic Distortion (THD).

FIG. 12 illustrates the frequency spectrum for an audio signal spectrum using an example embodiment of the present invention as illustrated in FIG. 8.

A graph 1200 includes a y-axis 1202 with dimensions of amplitude and units of dB and an x-axis 1204 with dimensions of frequency and units of Hz.

A DAC output signal spectrum 1206 initiates at x-axis 1204 frequency of 100 Hz and a corresponding y-axis 1202 amplitude of approximately −134 dB and is generally flat or decreases until it reaches an in-band minimum 1208. In-band minimum 1208 occurs approximately at x-axis 1204 frequency of 250 Hz and a corresponding y-axis 1202 amplitude of −140 dB.

DAC output signal spectrum 1206 increases monotonically from in-band minimum 1208 to a lower side lobe maximum 1210 located approximately at x-axis 1204 frequency of 500 Hz and a corresponding y-axis 1202 amplitude of −130 dB. DAC output signal spectrum 1206 decreases monotonically from lower side lobe maximum 1210 to a local minimum 1212 located at approximately x-axis 1204 frequency of 600 Hz and a corresponding y-axis amplitude of −136 dB. DAC output signal spectrum 1206 increases monotonically from local minimum 1212 to a maximum 1214 located approximately at x-axis 1204 frequency of 1 KHz and a corresponding y-axis 1202 amplitude of −12 dB.

DAC output signal spectrum 1206 decreases monotonically from maximum 1214 to a local minimum 1216 located at approximately x-axis 1204 frequency of 1200 Hz and a corresponding y-axis 1202 amplitude of −136 dB. DAC output signal spectrum 1206 increases monotonically from local minimum 1216 to an upper side lobe maximum 1218 located at approximately x-axis 1204 frequency of 1000 Hz and at a corresponding y-axis 1202 amplitude of −132 dB. DAC output signal spectrum 1206 decreases monotonically from upper side lobe maximum 1218 to a local minimum 1220 located approximately at x-axis 1204 frequency of 1300 Hz and corresponding y-axis 1202 amplitude of −138 dB. DAC output signal spectrum 1206 generally increases from local minimum 1220 to x-axis 1204 frequency of 20 KHz and an approximate y-axis 1202 amplitude of −130 dB. The region from local minimum 1220 to x-axis 1204 frequency of 20 KHz predominantly contains spurious intermodulation and quantization noise, as denoted by a spurious intermodulation 1222, a spurious intermodulation 1224 and a quantization noise 1226, respectively. Spurious intermodulation 1222 occurs at approximately x-axis 1204 frequency of 1500 Hz and a corresponding y-axis 1202 amplitude of −116 dB. Spurious intermodulation 1224 occurs approximately at x-axis 1204 frequency of 3500 Hz and a corresponding y-axis 1202 amplitude of −119 dB.

As illustrated in FIG. 12, the signal-to-noise ratio realized by the example embodiment of the present invention as illustrated in FIG. 8 exhibits a signal-to-noise ratio of 95.47 dB which is considered a high fidelity audio signal. Furthermore, the amplitudes of the spurious intermodulation components are reduced in the example embodiment of the present invention in FIG. 12 as compared to a convention implement as illustrated in FIG. 11. The reduction in the amplitudes of the spurious intermodulation components has a positive impact on the exhibited THD.

In accordance with the first example aspect of the present invention, a digital correction circuit provides a method for increasing the fidelity of converting a digital audio signal to its analog representation. The digital correction circuit operates to generate a pre-distorted signal for processing by a DAC and its associated components. The processing of the pre-distorted signal by the DAC and its related components operates to cancel the effects of clock signal jitter injected into the DAC. A high fidelity analog signal exhibiting high signal-to-noise ratio and low THD is generated as a result of applying the example embodiment of the present invention. Furthermore, the example embodiment of the present invention provides a high fidelity analog signal while reducing cost, power consumption and complexity.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A circuit comprising:
   a digital oscillator operable to output a reference clock signal;
   a PLL operable to output a system clock signal based on the reference clock signal;
   a digital signal generator operable to output a digital signal based on the system clock signal;
   a correction circuit operable to output a pre-distorted signal based on the reference clock signal, the system clock signal and the digital signal; and
   a digital to analog converter operable to output an analog signal based on the pre-distorted signal and the system clock signal;
   wherein said correction circuit comprises a time-to-digital converter operable to generate an estimated drift signal based on the reference clock signal and the system clock signal.

2. The circuit of claim 1, wherein said time-to-digital converter is operable to generate the estimated drift signal based on a time delay between a rising edge within the reference clock signal and a rising edge within the system clock signal.

3. The circuit of claim 2,
   wherein said correction circuit further comprises a linear predictor and a mixer,
   wherein said linear predictor is operable to generate a filtered signal based on the digital signal, and
   wherein said mixer is operable to mix the estimated drift signal with the filtered signal and to generate an estimated error signal.

4. The circuit of claim 3, wherein said correction circuit further comprises a subtractor operable to subtract the estimated error signal from the digital signal and to output the pre-distorted signal.

5. The circuit of claim 4, further comprising an interpolator operable to output an interpolated signal based on the pre-distorted signal.

6. The circuit of claim 5, further comprising a noise shaping portion operable to output a shaped signal based on the interpolated signal.

7. The circuit of claim 3, further comprising an interpolator operable to output an interpolated signal based on the pre-distorted signal.

8. The circuit of claim 1, further comprising an interpolator operable to output an interpolated signal based on the pre-distorted signal.

9. The circuit of claim 8, further comprising a noise shaping portion operable to output a shaped signal based on the interpolated signal.

10. The circuit of claim 1, further comprising an interpolator operable to output an interpolated signal based on the pre-distorted signal.

11. The circuit of claim 10, further comprising a noise shaping portion operable to output a shaped signal based on the interpolated signal.

12. The circuit of claim 2, further comprising an interpolator operable to output an interpolated signal based on the pre-distorted signal.

13. The circuit of claim 12, further comprising a noise shaping portion operable to output a shaped signal based on the interpolated signal.

14. A circuit comprising:
    a digital oscillator operable to output a reference clock signal;
    a PLL operable to output a system clock signal based on the reference clock signal;
    a digital signal generator operable to output a digital signal; and
    a correction circuit having a time-to-digital converter, a linear predictor, a mixer and a subtractor, said time-to-digital converter being operable to generate an estimated drift signal based on a time delay between a rising edge within the reference clock signal and a rising edge within the system clock signal, said linear predictor being operable to generate a filtered signal based on the digital signal, said mixer being operable to mix the estimated drift signal with the filtered signal and to generate an estimated error signal, said subtractor being operable to subtract the estimated error signal from the digital signal and to output a distorted signal.

15. A method of generating an analog signal, said method comprising:
    generating a reference clock signal with a digital oscillator;
    generating an output a system clock signal, with a PLL, based on the reference clock signal;
    generating a digital signal, with a digital signal generator, based on the system clock signal;
    generating a pre-distorted signal, with a correction circuit, based on the reference clock signal, the system clock signal and the digital signal; and
    generating an analog signal, with a digital to analog converter, based on the pre-distorted signal and the system clock signal;
    wherein said generating a pre-distorted signal comprises generating, with a time-to-digital converter, an estimated drift signal based on the reference clock signal and the system clock signal.

16. The method of claim 15, wherein said generating an estimated drift signal based on the reference clock signal and the system clock signal comprising generating the estimated drift signal based on a time delay between a rising edge within the reference clock signal and a rising edge within the system clock signal.

17. The method of claim 16, wherein said generating a pre-distorted signal further comprises generating a filtered signal, with a linear predictor, based on the digital signal, and mixing, with a mixer, the estimated drift signal with the filtered signal to generate an estimated error signal.

18. The method of claim 17, wherein said generating a pre-distorted signal further comprises subtracting, with a subtractor, the estimated error signal from the digital signal.

* * * * *